US008119304B2

(12) United States Patent
Takai et al.

(10) Patent No.: US 8,119,304 B2
(45) Date of Patent: Feb. 21, 2012

(54) FUEL CELL WITH FUEL PASSAGE LAYER HAVING A WIRING PATTERN

(75) Inventors: Yuichi Takai, Tokyo (JP); Yasuhiro Watanabe, Tokyo (JP)

(73) Assignee: Sony Corporation, Tokyo (JP)

( * ) Notice: Subject to any disclaimer, the term of this patent is extended or adjusted under 35 U.S.C. 154(b) by 571 days.

(21) Appl. No.: 10/416,762

(22) PCT Filed: Sep. 25, 2002

(86) PCT No.: PCT/JP02/09822
§ 371 (c)(1),
(2), (4) Date: Jun. 10, 2003

(87) PCT Pub. No.: WO03/028135
PCT Pub. Date: Apr. 3, 2003

(65) Prior Publication Data
US 2004/0048132 A1    Mar. 11, 2004

(30) Foreign Application Priority Data

Sep. 26, 2001 (JP) ............... P2001-294019
Nov. 5, 2001 (JP) ............... P2001-339444
Jan. 9, 2002 (JP) ............... P2002-002847
Sep. 9, 2002 (JP) ............... P2002-262320

(51) Int. Cl.
*H01M 8/24* (2006.01)
*H01M 2/14* (2006.01)

(52) U.S. Cl. ......... 429/513; 429/468; 429/455; 429/456
(58) Field of Classification Search .................. 429/13, 429/34
See application file for complete search history.

(56) References Cited

U.S. PATENT DOCUMENTS

| | | | | |
|---|---|---|---|---|
| 3,607,410 | A * | 9/1971 | Berger | 429/27 |
| 5,099,884 | A * | 3/1992 | Monahan | 137/827 |
| 5,640,995 | A * | 6/1997 | Packard et al. | 137/597 |
| 6,127,058 | A * | 10/2000 | Pratt et al. | 429/30 |
| 6,312,846 | B1 * | 11/2001 | Marsh | 429/30 |
| 6,541,147 | B1 * | 4/2003 | McLean et al. | 429/35 |
| 6,544,679 | B1 * | 4/2003 | Petillo et al. | 429/34 |
| 6,623,881 | B2 * | 9/2003 | Badding et al. | 429/30 |

(Continued)

FOREIGN PATENT DOCUMENTS

EP        0788172 A1    8/1997

(Continued)

OTHER PUBLICATIONS

Supplementary European Search Report mailed Jul. 1, 2011 for corresponding European Appln. No. 027728963.3.

*Primary Examiner* — Keith Walker
(74) *Attorney, Agent, or Firm* — K&L Gates LLP

(57) ABSTRACT

A fuel cell is provided. The fuel cell includes a power generator incorporated in a housing having air intake ports, an electrical terminal connected to a printed-wiring board, and connectors and a fuel passage for supplying fuel. The terminals are formed in such configurations as to be insertion-mounted on the printed-wiring board or to be surface mounted on the printed-wiring board. The fuel cell is directly mounted on the printed-wiring board. Thus, a cell housing part or a fixing mechanism, a connector, for example, do not need to be provided on an electric device on which the fuel cell is mounted and the structure of the device itself is simplified and miniaturized.

8 Claims, 30 Drawing Sheets

U.S. PATENT DOCUMENTS

| | | | |
|---|---|---|---|
| 6,689,502 B2 * | 2/2004 | Choi | 429/32 |
| 2002/0108740 A1 * | 8/2002 | Hidaka et al. | 165/135 |

FOREIGN PATENT DOCUMENTS

| | | | |
|---|---|---|---|
| JP | 62-243258 | | 10/1987 |
| JP | 62-243259 | | 10/1987 |
| JP | 08-321317 | | 12/1996 |
| JP | 8-321317 | | 12/1996 |
| JP | 2001-6717 | | 1/2001 |
| JP | 2001-93561 | | 4/2001 |
| JP | 2001-093561 | | 4/2001 |
| JP | 2001-93562 | | 4/2001 |
| WO | WO00/02270 | * | 1/2000 |
| WO | 00/45457 | | 8/2000 |

* cited by examiner

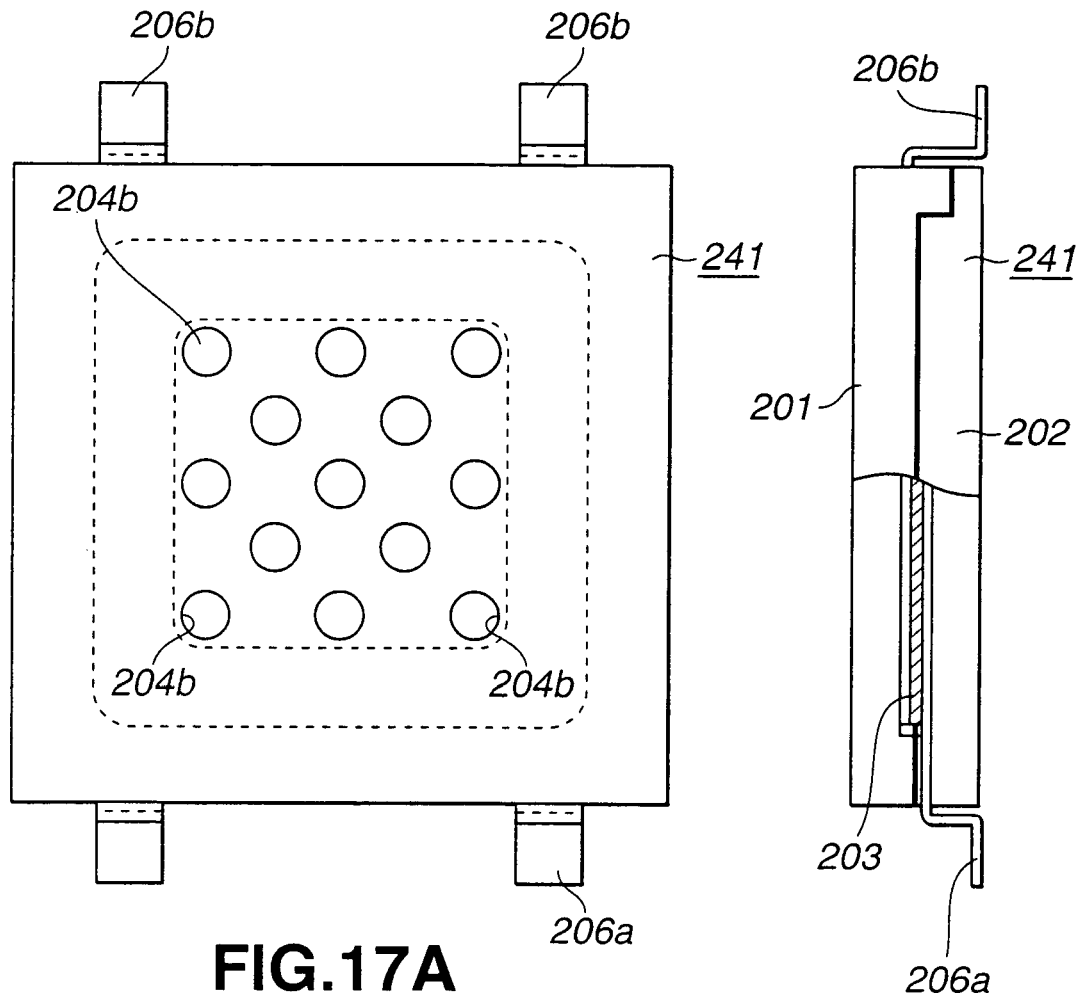
FIG.17A
FIG.17C
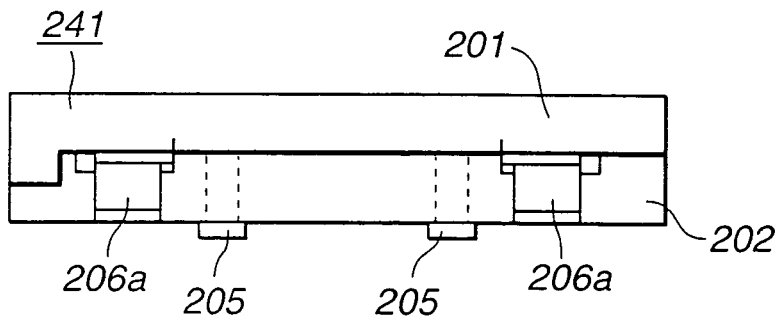
FIG.17B

FUEL CELL WITH FUEL PASSAGE LAYER HAVING A WIRING PATTERN

CROSS REFERENCES TO RELATED APPLICATIONS

The present application claims priority to Japanese Patent Document Nos. P2001-294019 filed on Sep. 26, 2001; P2001-339444 filed on Nov. 5, 2001; P2002-002847 filed on Jan. 9, 2002; and P2002-262320 filed on Sep. 9, 2002 the disclosures of which are herein incorporated by reference.

BACKGROUND OF THE INVENTION

The present invention generally relates to a fuel cell. More specifically, the present invention relates to a fuel cell for generating an electromotive force in a power generator by supplying hydrogen and oxygen (air) as fuel gases and an electric device using the fuel cell.

A fuel cell that is a device for generating an electromotive force in a power generator by supplying hydrogen and oxygen (air) as fuel gases has been hitherto proposed. The fuel cell of this type ordinarily has a structure that an electrolyte film (proton conductive film) is sandwiched in between gas electrodes to obtain a desired electromotive force. Such a fuel cell has been expectedly applied to an electric vehicle or a hybrid type vehicle and progressively developed to be put to practical use. The fuel cell has been employed for the vehicle such as a motor vehicle. In addition thereto, the fuel cell has been studied to apply to new uses completely different from the uses of vehicles such as motor vehicles by making use of an advantage that its lightweight and compact form can be easily realized. For instance, a fuel cell which can be used as a new power source in place of a dry cell or a rechargeable battery which has been used as a power source of a portable electric device has been studied.

A compact fuel cell capable of being incorporated in various kinds of electric devices has been progressively studied in various ways and some types of fuel cells have been already proposed. Any of them has a battery itself made compact, however, it is not necessarily satisfactory from an aspect that the fuel cell is incorporated in the electric device. For instance, when the previously proposed fuel cell is incorporated in the electric device, a cell housing part is provided in the device side like ordinary dry cells, various kinds of secondary batteries such as lithium-ion secondary batteries, and the like. Thus, a mechanism for fixing the cell or a connector for wiring or the like is provided therein.

Since the fuel cell needs fuel gas, fuel piping needs to be provided to supply fuel. Since the piping is necessary, a mechanism for preventing the leakage of fuel from the piping needs to be added.

When each of the fuel cells which have been conventionally proposed is applied to the electric device, particularly to a compact portable electric device, not only the entire part of the device is hardly made compact, but also the design of the device is subjected to a restriction. Furthermore, manufacturing steps upon manufacturing the device are complicated.

When the fuel cell is incorporated in the electric device, someone may utilize a structure that the power generator of the fuel cell is incorporated in a device main body and a fuel storage part, for instance, a hydrogen tank is separately mounted on the device main body. In this case, the power generator needs to be arranged near the hydrogen tank and the device undergoes a great restriction in its design. When the power generator is separated from the fuel storage part, piping serving as a fuel passage needs to be provided between them. Consequently, piping parts such as tubes needs to be drawn around in the device. Thus, the number of parts is increased and the form of the device itself is enlarged, so that an assembly work is complicated.

SUMMARY OF THE INVENTION

The present invention provides a new and improved fuel cell as compared to conventional fuel cells, such as those described above, and an electric device using this fuel cell. For example, the present invention provides a fuel cell without preventing an electric device using the fuel cell as a power source from being miniaturized and giving a restriction to the design of the electric device.

Further, the present invention can provide a fuel cell without increasing manufacturing steps when an electric device is manufactured. The present invention can provide an electric device which can lighten a restriction in design while a fuel cell is incorporated in the electric device, can reduce the number of parts and miniaturize them and can realize the simplification of manufacturing steps. The present invention can provide a new printed-wiring board functioning not only as a circuit board, but also as a fuel passage and a method for manufacturing the printed-wiring board.

Still further, the present invention can provide a connector for a fuel cell that can be used as a connector for an electric connection as well as for a fuel joint between a power generating cell and a fuel supply source.

Still further, the present invention can provide such a method for mounting a fuel cell in which the leakage of fuel can be prevented and the fuel cell can be mounted on an electronic circuit board such as a printed-wiring board by using a conventional device mounted on the electric device.

A fuel cell according to an embodiment of the present invention has a power generator incorporated in a housing having air intake ports, an electrical terminal connected to a board, and connectors and a passage for supplying fuel.

In an electric device according to an embodiment of the present invention, the fuel cell is directly mounted on the board. Since the fuel cell is directly mounted on the substrate, the electric device according to an embodiment of the present invention does not need to provide a cell housing part, a mechanism for fixing the fuel cell, a connector, or the like. on the device on which the fuel cell is mounted. Thus, the structure of the device itself is simplified and miniaturized. In the electric device having the board on which the fuel cell is directly mounted, restrictions in design such as the arrangements of various kinds of devices or wiring patterns are decreased and wasteful wiring and spaces and the loss of output or the like are also reduced.

On an electronic board according to an embodiment of the present invention, the wiring patterns are formed and the fuel passages are formed. The electronic board according to an embodiment of the present invention having the above-described structure not only has a function as an ordinary circuit board, but also has a function as fuel passages. Since the fuel passages are incorporated in a wiring board, the electronic board can be treated like an ordinary electronic board. Such a structure is a new structure characteristic of the present invention and provides new uses for the electronic board.

In a method for manufacturing the electronic board according to an embodiment of the present invention, a fuel passage form layer on which the fuel passages are formed as an inner layer and a wiring layer on which wiring patterns are formed are laminated. Such a method is used so that the electronic board also having a function as fuel passages can be manufactured without substantially changing manufacturing processes of a conventional electronic board.

The electric device according to an embodiment of the present invention includes a power generator of the fuel cell and a fuel storage part for supplying fuel to the power generator which are incorporated in an electric device main body device, and a board. On the board, fuel passages as well as wiring patterns are formed. The fuel is supplied to the power generator from the fuel storage part through the fuel passages on the board. The electric device according to an embodiment of the present invention does not depend on the arranged position of the power generator or the fuel storage part and a restriction in design of the device is lightened. Since the fuel is supplied through the board, piping part such as tubes do not need to be pulled around. Thus, the number of parts is reduced and the device is miniaturized.

A connector for a fuel cell according to an embodiment of the present invention includes a printed-wiring board on which wiring patterns are formed and fuel passages are formed. An electric signal and fuel are supplied and received through the printed-wiring board. The connector for the fuel cell of the present invention is used, for instance, as a connector between a power generator of the fuel cell and a fuel supply source, and exhibits a function as a connector for an electric connection and a function as a fuel joint.

Another fuel cell according to an embodiment of the present invention includes a power generator incorporated in a housing having air intake ports, an electrical terminal connected to a wiring member, and a connector for supplying fuel on a surface opposed to the wiring member. The wiring member used in the fuel cell according to an embodiment of the present invention has fuel passages formed in an inner layer and fuel supply ports as openings on the surface of an upper layer. In the electric device according to an embodiment of the present invention, a part between the wiring member and the fuel cell is sealed with a resin. An adhesive or a moldable resin allows the fuel cell according to an embodiment of the present invention to be mounted on the electric device by fixing a part between the fuel cell and the wiring member.

The fuel cell according to an embodiment of the present invention includes a passage for supplying fuel to the fuel cell formed on a wiring member. Accordingly, a cell housing part, a mechanism for fixing the fuel cell, a connector, fuel piping, or the like do not need to be provided on the device on which the fuel cell is mounted. As a result, the structure of the device is simplified and miniaturized. Since the fuel piping is not exposed, the fuel can be effectively sealed. Thus, a structure for preventing the leakage of fuel does not need to be added. According to an embodiment of the present invention, since the fuel cell is directly mounted on a printed-wiring board, restrictions in design concerning the arrangements of various kinds of devices or wiring patterns are decreased and wasteful wiring, piping or spaces, the loss of output, etc. are also decreased. The fuel cell is fixed to the printed-wiring board with an adhesive or a mold resin, so that a device similar to a method for mounting a conventional electric device can simply fix the fuel cell and seal fuel.

Additional features and advantages of the present invention are described in, and will be apparent from, the following Detailed Description of the Invention and the figures.

BRIEF DESCRIPTION OF THE FIGURES

FIG. 17A is a schematic plan view showing one example of a fuel cell having an insertion-mount type package structure, FIG. 17B is a side view of the above and FIG. 17C is a partly sectional view of the above according to an embodiment of the present invention.

FIG. 21A is a plan view of an upper layer, FIG. 21B is a plan view of an intermediate layer and FIG. 21C is a plan view of a lower layer according to an embodiment of the present invention.

DETAILED DESCRIPTION OF THE INVENTION

The present invention generally relates to fuel cells. In particular, the present invention relates to a fuel cell capable of generating an electromotive force in a power generator by supplying hydrogen and oxygen (air) as fuel gases and an electric device using the fuel cell.

Figure 1:
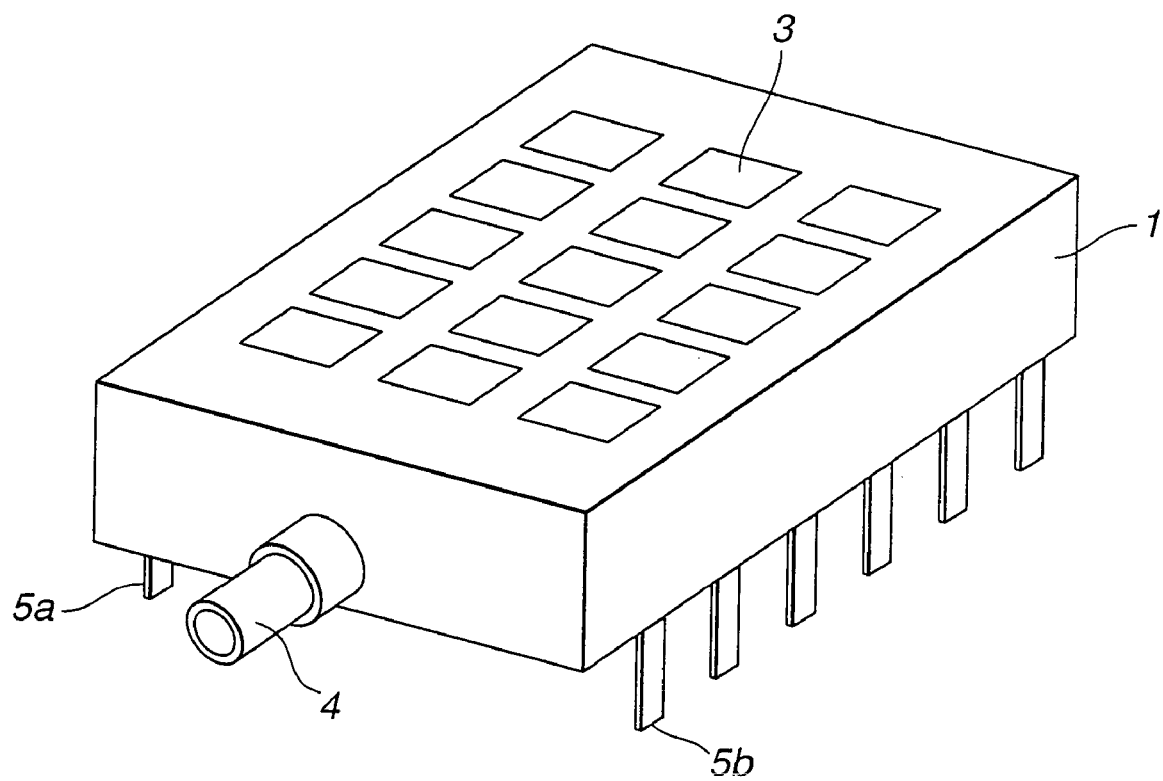
FIG. 1 is a schematic perspective view showing one example of a fuel cell according to an embodiment of the present invention which has a insertion-mount type package structure.

FIG. 1 shows one example of a fuel cell according to an embodiment of the present invention. The fuel cell shown in FIG. 1 uses a insertion-mount type package called a dual inline package (DIP). One or two or more power generators 2 are incorporated in a housing 1. Air is supplied to a cathode side from air intake ports 3 provided on the housing 1. Fuel (hydrogen) is supplied to an anode side from a fuel joint 4 likewise attached to the housing 1 to generate power.

A plurality of terminal pins 5a and 5b connected to anodes (fuel electrodes) or cathodes (air electrodes) of the power generators 2 are drawn out from the housing 1. An electric connection to an electric device is carried out through the terminal pins 5a and 5b. That is, the fuel cell having a structure shown in FIG. 1 is mounted on a printed-wiring board by, for instance, inserting the terminal pins 5a and 5b into connecting holes provided on the printed-wiring board incorporated in the electric device side and soldering them. Thus, the electrodes of the fuel cell are electrically connected to wiring formed on the printed-wiring board so that electric power is supplied to the circuit of the electric device side.

Figure 2:
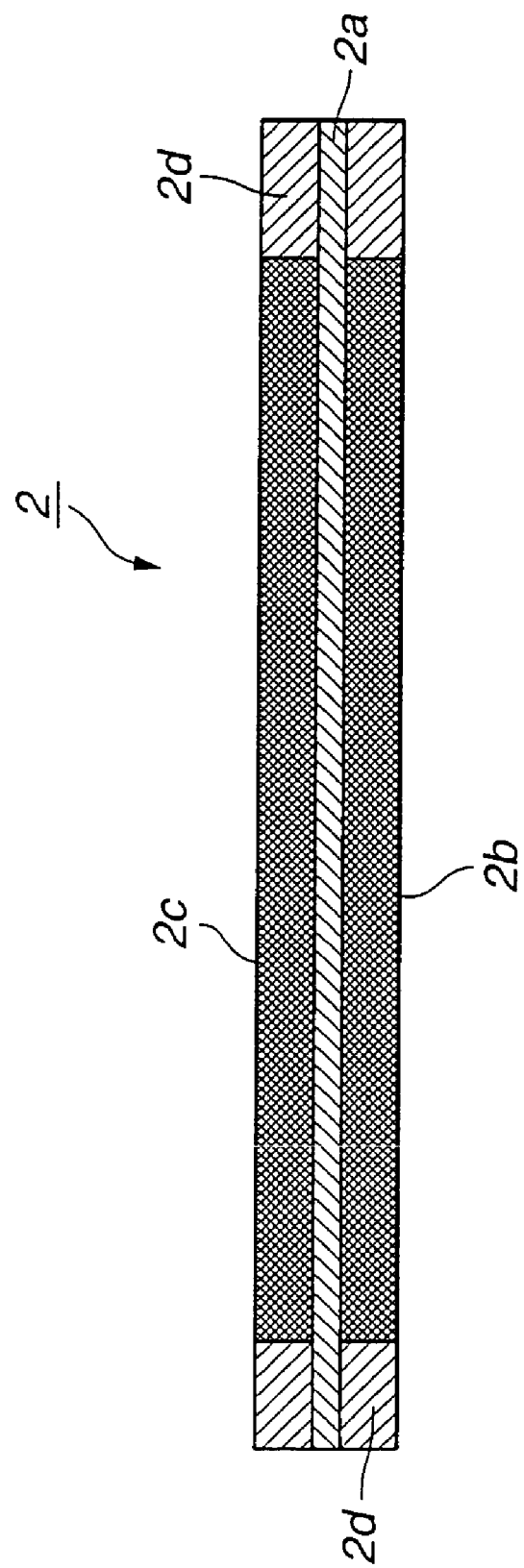
FIG. 2 is a schematic sectional view showing one structural example of a power generator according to an embodiment of the present invention.

The power generator 2 has a structure that an ion conductive film 2a is held at both sides between an anode 2b and cathode 2c respectively as one electrode and peripheries thereof are sealed with seals 2d, as shown in FIG. 2. This seal 2d is provided for the purpose of preventing hydrogen from leaking to the cathode side 2c. The seal 2d may be formed by bonding together materials which are previously formed by an injection molding or punching, or the like or may be directly formed on the ion conductive film 2a or the electrodes.

Figure 3:
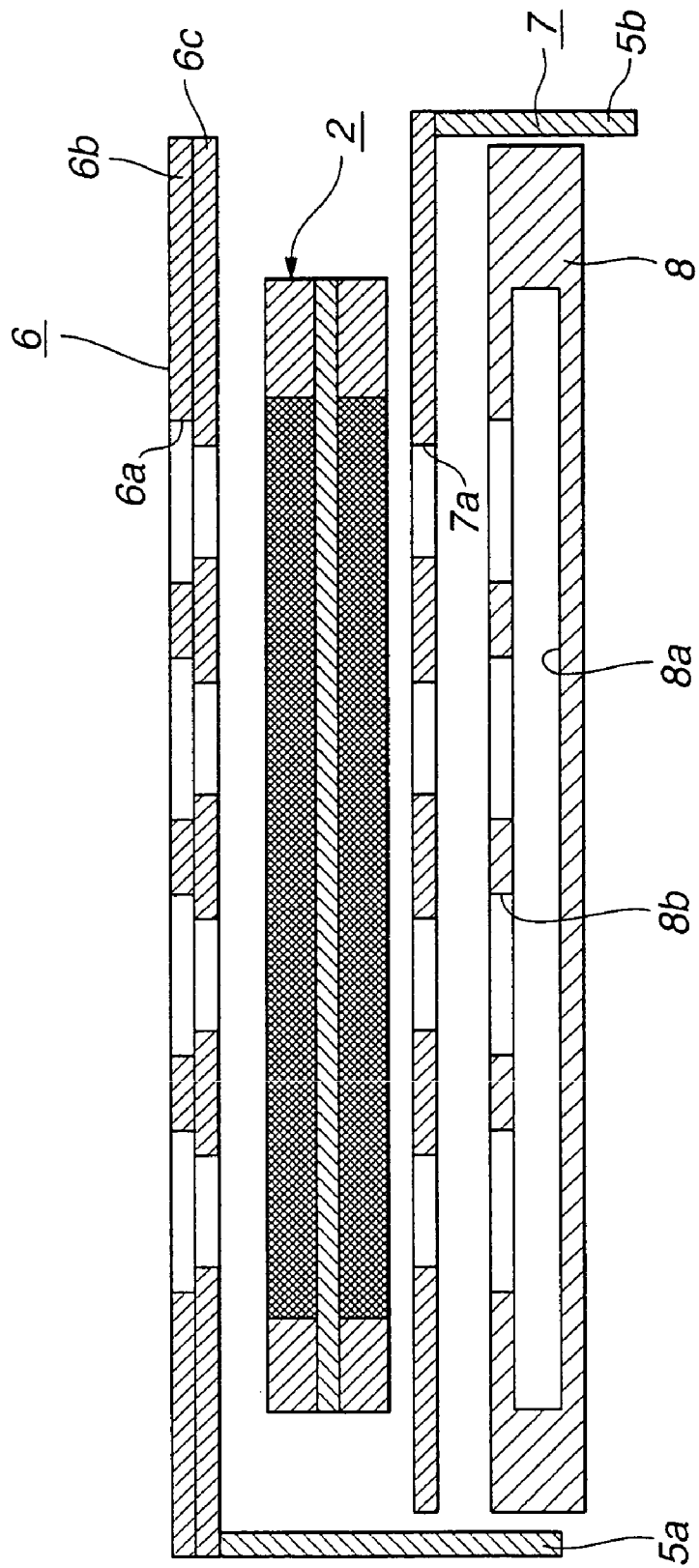
FIG. 3 is a schematic sectional view showing a disassembled state of the fuel cell shown in FIG. 1 according to an embodiment of the present invention.

FIG. 3 shows a state that the fuel cell to which the present invention is applied is disassembled. The fuel cell of this embodiment has a structure that the power generator 2 is sandwiched in between a pair of current collectors 6 and 7. The current collectors 6 and 7 respectively have opening parts 6a and 7a provided for taking fuel. Hydrogen as fuel and oxygen (air) are taken into the anode 2b and the cathode 2c through these opening parts 6a and 7a.

The current collector 6 of the cathode 2c side has a two-layer structure. The structure includes an insulating material layer 6b made of an insulating material in an exposed side as the surface of the housing 1 and a current collecting part 6c made of a conductive material in a side coming into contact with the power generator 2. The current collector 7 of the anode 2b side is made of a conductive material, and is not especially provided with such an insulating material layer as that provided in the current collector 6 of the cathode 2c, side. Here, as the conductive material which forms the current collecting part 6c of the current collector 6 in the cathode 2c side or the current collector 7 of the anode 2b side, a metallic plate, a carbon sheet or the like may be used. In addition thereto, what is called a single-sided board that a conductive layer is formed on a polymer film, a glass epoxy board, a ceramic board, etc. may be used. Otherwise, a paste printing or plating may be applied to the power generator 2 to directly form a current collecting layer thereon.

The current collecting part 6c of the current collector 6 or the current collector 7 is electrically connected respectively to the terminal pins 5a and 5b through which an electric connection to the electric device is achieved. The ends of the terminal pins 5a and 5b are desirably have forms, for instance, thin plate shapes or pin shapes so as to be inserted into the connecting holes provided in the printed-wiring board. Further, the ends of the terminal pins 5a and 5b desirably have such a rigidity as to be fixed to the printed-wiring board. When the current collecting part 6c of the current collector 6 or the current collector 7 is made of the metallic plate, the ends of the terminal pins 5a and 5b are machined to the thin plate shapes or pin shapes, so that they may be provided integrally. The terminal pins 5a and 5b may be separately provided and they may be mechanically and electrically connected to the current collecting part 6c of the current collector 6 or the current collector 7.

In the outside of the current collector 7 of the anode side, a hydrogen supply part 8 having a passage 8a for hydrogen as fuel is arranged and a fuel joint 4 is fixed. Further, in the hydrogen supply part 8, opening parts 8b are opposed to opening parts 7a provided in the current collector 7. The hydrogen as the fuel is supplied to the anode 2b of the power generator 2 through the passage 8a, the opening parts 8b and the opening parts 7a from the fuel joint 4. The hydrogen supply part 8 may be formed as one part, or may be formed integrally with the current collector 7 or the housing 1.

Figure 4:
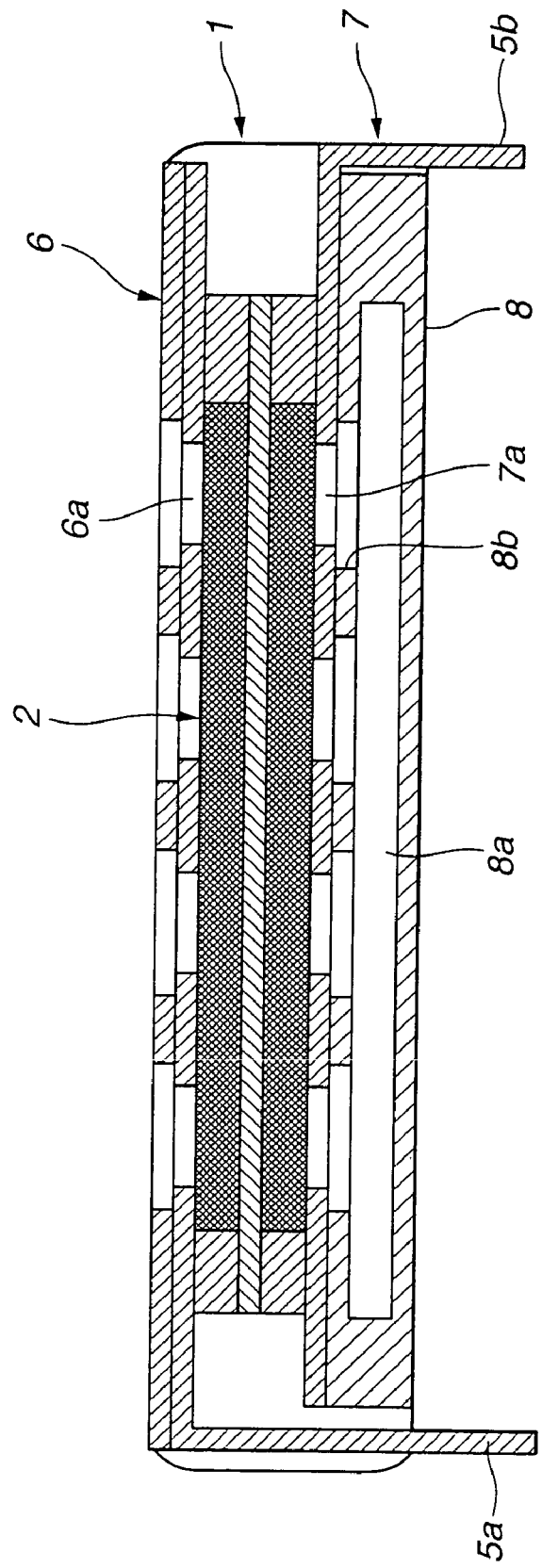
FIG. 4 is a schematic sectional view showing an assembled state according to an embodiment of the present invention.

The power generator 2, the current collectors 6 and 7 and the hydrogen supply part 8 as the above-described components are superposed together to have a laminated body. These components are fixed together with the housing 1 to have a packaged body as shown in FIG. 4. In this embodiment, the laminated body is packaged and the housing is formed simultaneously by a resin mold. The housing 1 is formed integrally with the laminated body. It is to be understood that a variety of structures other than this structure may be employed. For instance, a structure that the housing is divided into two upper and lower parts and the laminated body is sandwiched in between these parts and fixed by screws may be used. In addition, a structure that the upper and lower housing parts are fixed by an ultrasonic welding or bonding process or the like may be employed.

In the fuel cell having the above-described structure, when the hydrogen as fuel is allowed to enter the hydrogen supply part 8 so as to come into contact with the anode 2b and air (oxygen) is allowed to enter from the opening parts 6a so as to come into contact with the cathode 2c, a reaction represented by the following reaction formula is generated in the anode 2b side.

$$H_2 2H^+ + 2e^-$$

In the cathode 2c side, a reaction represented by a reaction formula described below is generated.

$$\tfrac{1}{2}O_2 + 2H^+ + 2e\text{-}H_2O + \text{heat of reaction } Q$$

In the entire part, a reaction represented by $H_2 + \tfrac{1}{2}O_2\ H_2O$ is generated. That is, in the anode 2b side, hydrogen discharges an electron to become a proton, passes through the ion conductive film 2a to move to the cathode 2c side, and receives the supply of the electron in the cathode 2c to react with oxygen. An electromotive force is obtained in accordance with such an electrochemical reaction.

Now, another embodiment of a fuel cell according to the present invention will be described. The fuel cell of this embodiment uses a surface-mount type package form called a BGA (Ball Grid Array).

Figure 5:
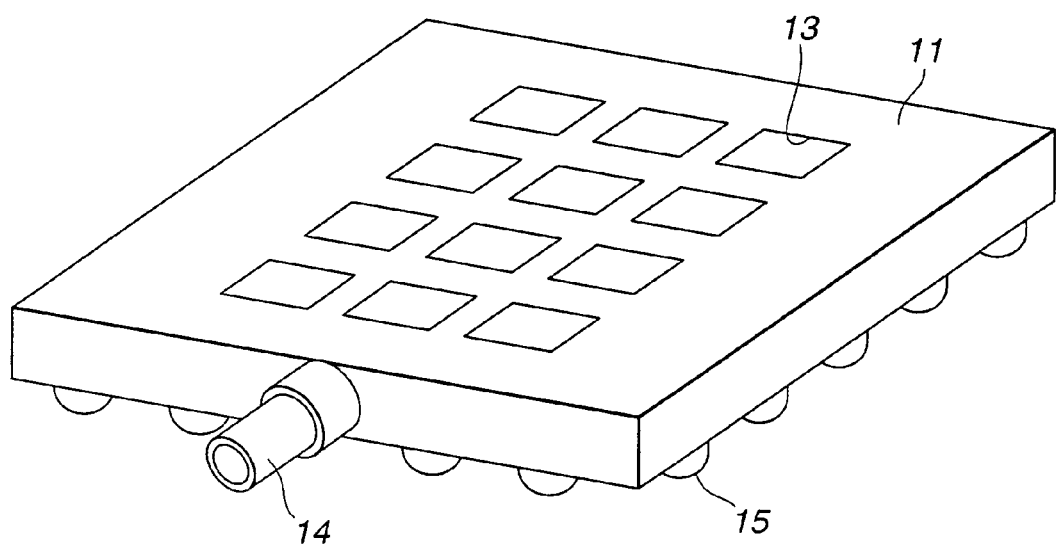
FIG. 5 is a schematic perspective view showing one example of a fuel cell having a surface-mount type package structure according to an embodiment of the present invention.

The basic structure of the fuel cell of this embodiment is the same as that of the above-described embodiment. As shown in FIG. 5, a power generator 12 is contained in a housing 11. Air is supplied to a cathode side from air intake ports 13 provided in the housing 11 and fuel (hydrogen) is supplied to an anode side from a fuel joint 14 likewise attached to the housing 11 to generate electric power.

An electric connection to an electric device is carried out through terminals 15. Here, the terminals 15 are formed in shapes of balls or protrusions made of a conductive material such as solder differently from those of the above-described embodiment. The terminals 15 are mechanically and electrically connected to terminal parts formed on a mount board of the electric device side.

Figure 6:
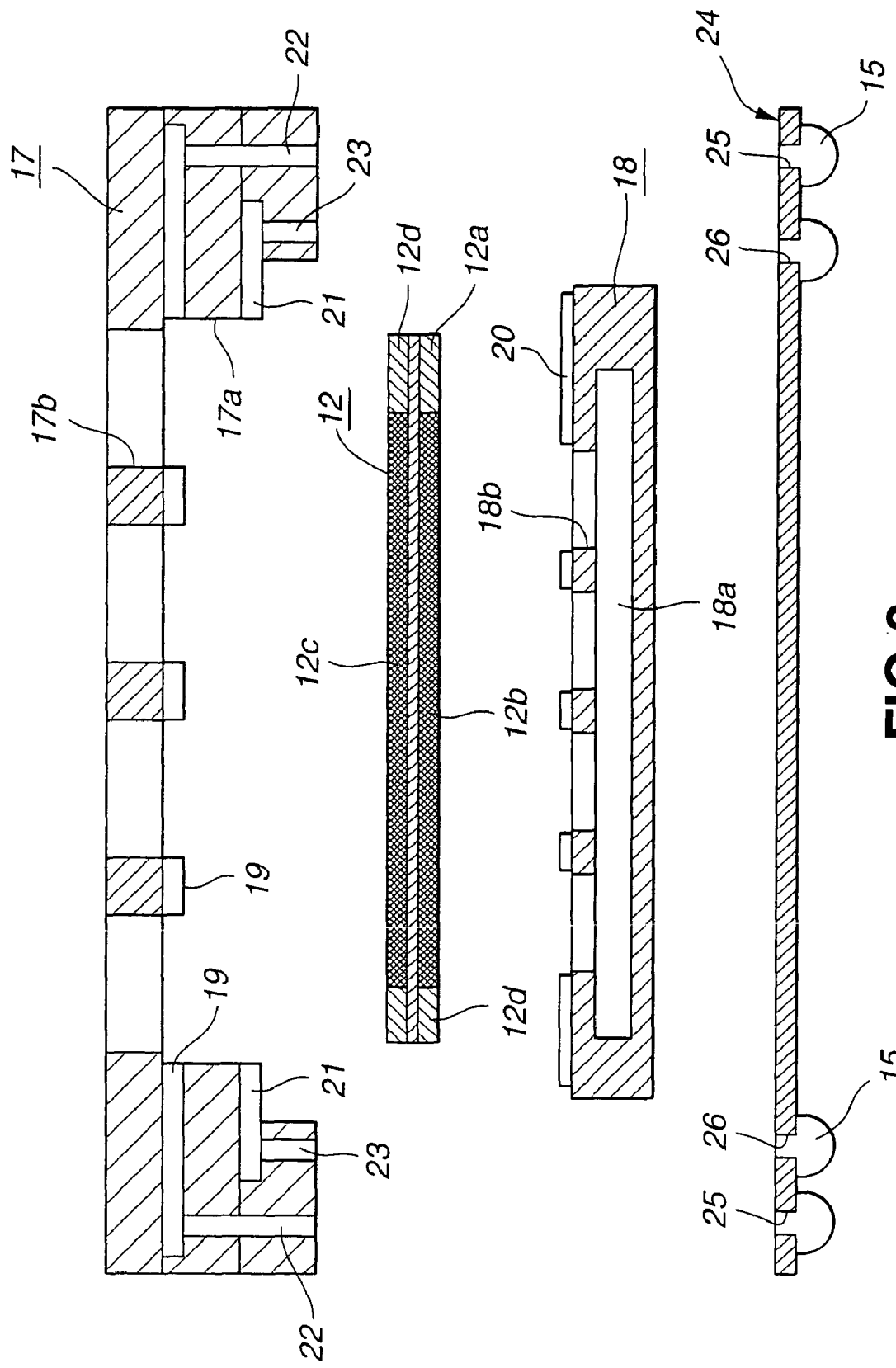
FIG. 6 is a schematic sectional view showing a disassembled state of the fuel cell shown in FIG. 5 according to an embodiment of the present invention.

FIG. 6 is a schematic sectional view showing a state that the fuel cell shown in FIG. 5 is disassembled. The structure of the contained power generator 12 is the same as that of the above-described embodiment. An ion conductive film 12a has a structure that the conductive film is held at both sides between electrodes, that is, an anode 12b and a cathode 12c and peripheries thereof are sealed with a seal 12d.

The power generator 12 is sandwiched in between a base substrate 17 and a hydrogen supply part 18. The base substrate 17 forms a part of the housing 11 and employs, for instance, a resin substrate such as glass epoxy, phenolic resin, polyimide, and/or the like, or an inorganic substrate such as ceramics, glass, silicon, and/or the like. The base substrate 17 has a recessed part 17a capable of housing the power generator 12. Air intake opening parts 17b are formed on the bottom part of the recessed part 17a. Cathode current collectors 19 are formed on the inner surface of the base substrate 17 as a surface that comes into contact with the cathode 12c of the power generator 12.

On the other hand, the hydrogen supply part 18 is arranged so as to cover the power generator 12 housed in the base substrate 17. The hydrogen supply part 18 has a passage 18a for hydrogen as fuel and hydrogen intake opening parts 18b formed on a surface that comes into contact with the anode 12b of the power generator 12. On the surface of the hydrogen supply part 18 that comes into contact with the anode 12b of the power generator 12, anode current collectors 20 are formed integrally. Otherwise, the hydrogen supply part 18 itself may be made of a conductive material to serve as an anode current collector.

The power generator 12 is sandwiched in between the base substrate 17 and the hydrogen supply part 18 so that the current collecting structures of the anode 12b and the cathode 12c of the power generator 12 are realized. In this embodiment, the base substrate 17 has a three-layer structure. In the parts of the base substrate 17 that come into contact with the hydrogen supply part 18, wiring layers 21 connected to the anode current collectors 20 are formed. Electric connections between the respective layers are carried out through via holes 22 and 23. The hydrogen supply part 18 is preferably fixed to the base substrate 17 under this state. Further, the hydrogen supply part 18 may be fixed to the base substrate 17 simultaneously with the attachment of a cover substrate as described below. As a fixing method, a bonding method by a resin may be exemplified.

In the back surface side of the base substrate 17 located in the lower part of FIG. 6, a cover substrate 24 is provided. The power generator 12 disposed in the recessed part 17a of the recessed base substrate 17 and the hydrogen supply part 18 are secured by the base substrate 17 and the cover substrate 24. In the cover substrate 24, via holes 25 and 26 are provided so as to correspond to the via holes 22 and 23. Further, the via holes 25 and 26 are provided with hemispherical terminals 15. As the hemispherical terminals 15, for instance, solder balls can be used. The solder balls are fixed to connecting terminals formed on a printed-wiring board of an electric device side by performing a reflowing process to achieve an electric connection.

Figure 7:
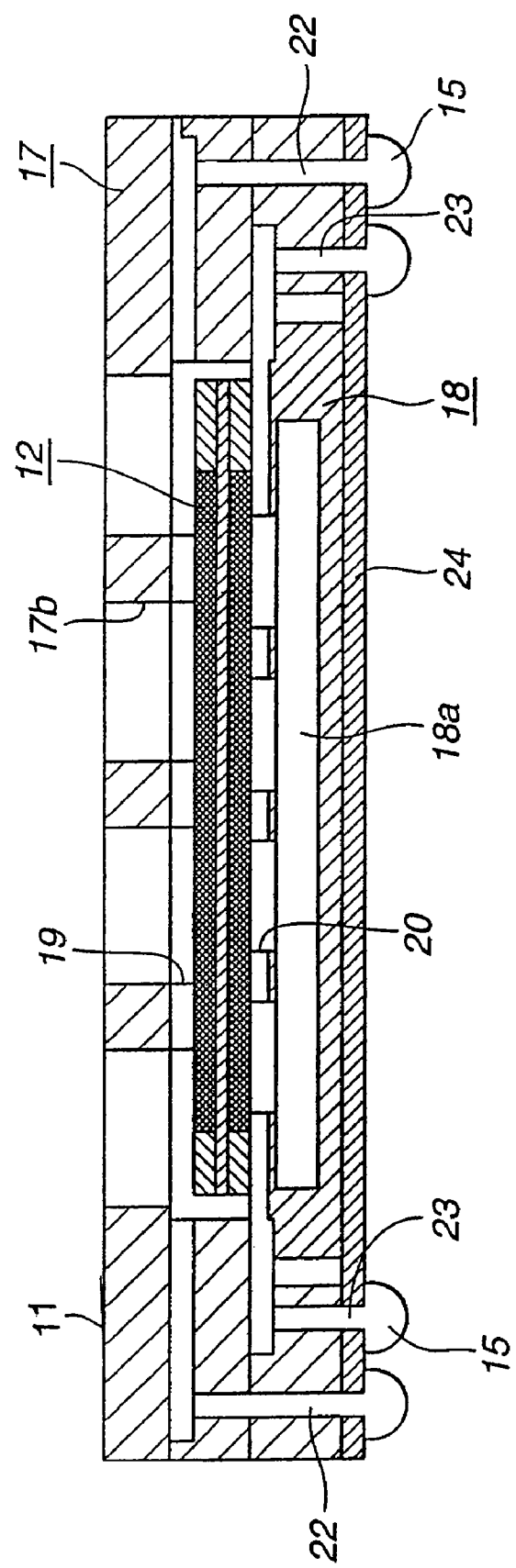
FIG. 7 is a schematic sectional view showing an assembled state according to an embodiment of the present invention.

FIG. 7 shows an assembled state of the fuel cell. Under the assembled state, the housing 11 is formed and packaged by the base substrate 17 and the cover substrate 24. The terminals 15 are arranged on the bottom part thereof. Accordingly, the fuel cell having the above-described structure is configured as a fuel cell having a surface-mount type package. The surface-mount type package form is not limited to the BGA and, for instance, a QFP (Quad Flat Package) or the like may be used.

Figure 8:
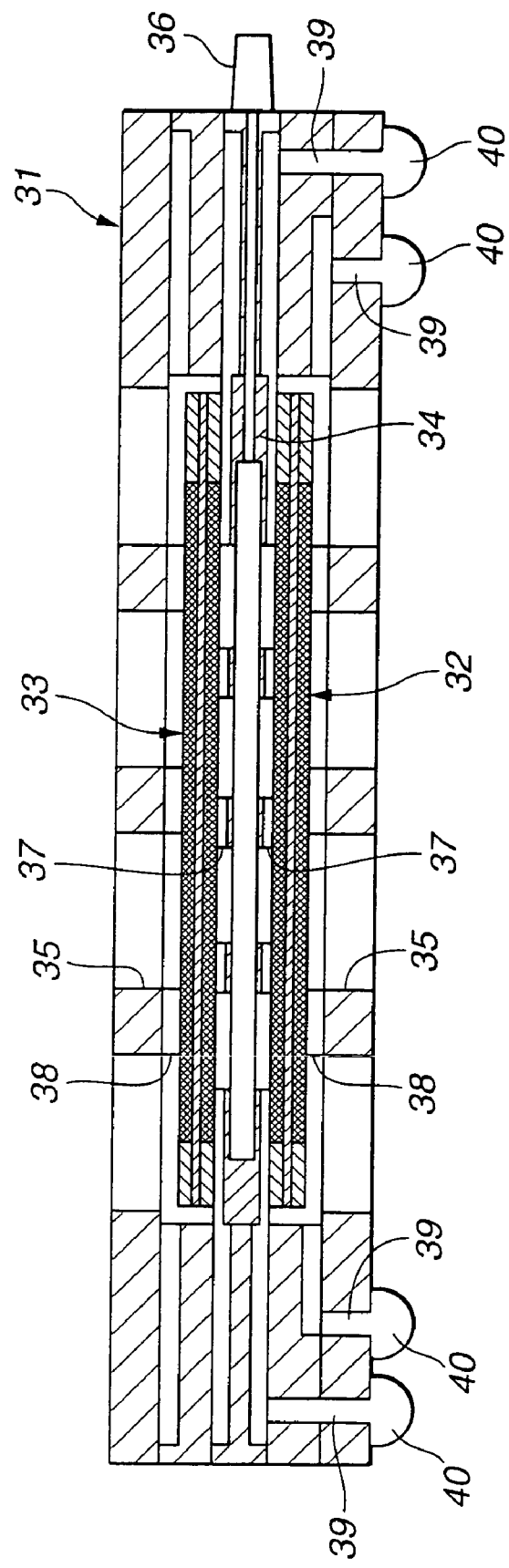
FIG. 8 is a schematic sectional view showing one example of a fuel cell in which plurality of power generators are incorporated according to an embodiment of the present invention.

Now, a structural example of a fuel cell in which a plurality of power generators, for instance, two power generators are incorporated will be described below. FIG. 8 shows one example of a fuel cell with a BGA package form in which the two power generators are incorporated. In this example, two sets of power generators 32 and 33 are disposed on both the surfaces of a hydrogen supply part 34 in a housing 31. Further, on the housing 31, air intake ports 35 are provided on both upper and lower surfaces. The hydrogen supply part 34 has a fuel joint 36 to be connected to an external fuel source likewise the above-described embodiments.

Further, on both the surfaces of the hydrogen supply part 34, anode current collectors 37 are formed. On the surfaces of the housing 31 that come into contact with the power generators 32 and 33, cathode current collectors 38 are formed, respectively. These current collectors are connected to terminals 40 through via holes 39. The terminals 40 are respectively formed in shapes of balls and can be mounted on the surface of a printed-wiring board of an electric device.

Now, a printed-wiring board or a method for manufacturing it to which the present invention is applied will be described. Further, an electric device and a connector for a fuel cell to which the printed-wiring board and the method for manufacturing it are applied will be described in detail by referring to the drawings.

Figure 9:
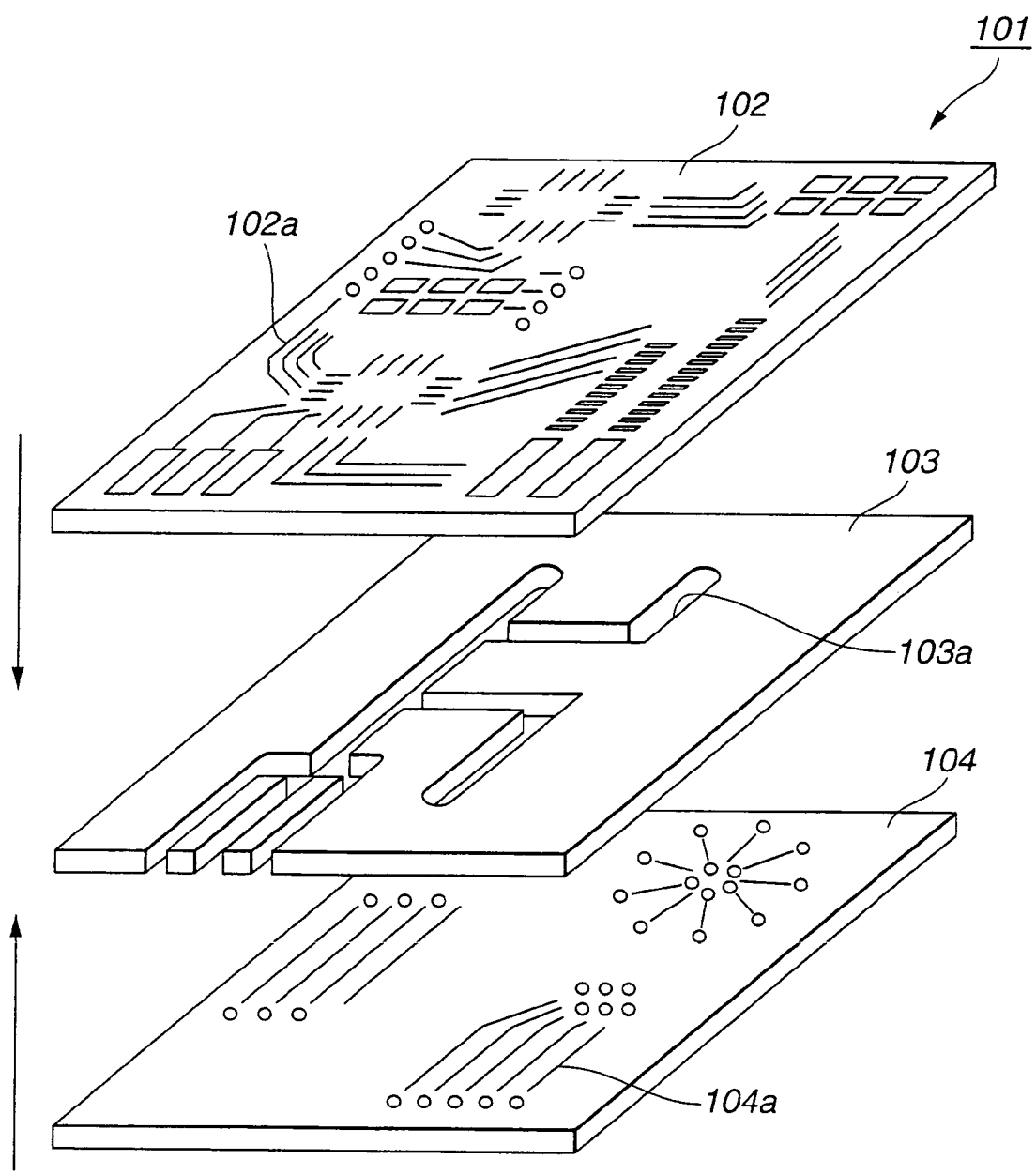
FIG. 9 is an exploded perspective view showing one example of a printed-wiring board according to an embodiment of the present invention.

FIG. 9 shows one embodiment of a printed-wiring board according to the present invention. This printed-wiring board 101 has a structure including a first electric circuit wiring layer 102, a fuel passage forming layer 103 and a second electric circuit wiring layer 104. The fuel passage form layer 103 is an inner layer. The fuel passage form layer 103 is held from both sides between the first electric circuit wiring layer 102 and the second electric circuit wiring layer 104.

As a base material of the electric circuit wiring layers 102 and 104 or the fuel passage form layer 103, arbitrary insulating materials such as a resin, a glass epoxy material, ceramics, glass, etc. may be used. In this case, a material having no or little leakage of fuel needs to be used.

On the fuel passage form layer 103, prescribed fuel passages 103a are formed by grooving or boring. For instance, fuel is supplied to the power generator of a fuel cell through these fuel passages 103a. The fuel passages 103a formed by punching the fuel passage form layer 103 to prescribed forms function as fuel piping by covering the upper and lower parts thereof with the electric circuit wiring layers 102 and 104.

The electric circuit wiring layers 102 and 104 respectively have structures the same as that of a wiring layer used in an ordinary multi-layer wiring board and form a single-sided board, a double-sided board, or a multi-layer board. Then, wiring patterns 102a and 104a are formed in accordance with electric circuits on both surfaces, a single surface, or each layer of the multi-layer board. The wiring patterns 102a and 104a are formed, for instance, by patterning a copper foil by a photolithography technique. The electric circuit wiring layers 102 and 104 may be electrically connected together, or may be separated to individually function. Especially, when the electric circuit wiring layers 102 and 104 are electrically connected together, the fuel passage form layer 103 may be formed as a double-sided wiring board on which wiring patterns are formed. The electric circuit wiring layers 102 and 104 may be electrically connected together through this fuel passage form layer 103.

These electric circuit wiring layers 102 and 104 and the fuel passage form layer 103 are laminated and pressed to be integrated so that the printed-wiring board 101 having the fuel passages incorporated is formed. This printed-wiring board 101 is similar to a conventional printed-wiring board except that the fuel passages 103a are incorporated therein and can be incorporated in an electric device or the like likewise the ordinary printed-wiring board. At this time, since the fuel passages 103a are contained in the printed-wiring board 101, they do not interfere with a structure.

In this embodiment, although the fuel passage form layer 103 undergoes a grooving and a boring to form the fuel passages 103a, the present invention is not limited thereto, and, for instance, pipe shaped parts may be incorporated to form fuel passages. In this case, the pipe shaped parts may be embedded in a resin layer or an adhesive layer and an electric circuit wiring layer may be bonded to both the sides or a one side thereof. In the above-described embodiment, although the fuel passage form layer is formed in one layer, the present invention is not limited thereto, and the fuel passage form layers may be formed in a plurality of layers. In this case, multi-layer wiring boards in which the fuel passages are already contained may be laminated.

Now, a method for manufacturing a printed-wiring board according to an embodiment of the present invention will be described. To manufacture the printed-wiring board according to an embodiment of the present invention, various methods may be considered. As a first example of the methods, a double-sided wiring board is punched to the forms of fuel passages and wiring boards are laminated on the upper and lower sides of the double-sided board. FIG. 10 shows one embodiment of the above-described manufacturing processes.

Figure 10A:
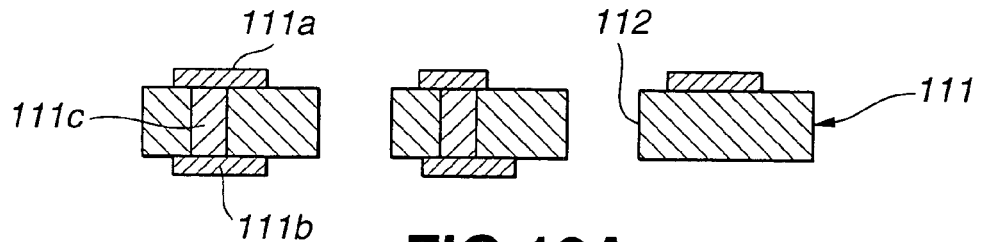
FIGS. 10A, 10B and 10C are schematic sectional views showing one example of manufacturing processes of the printed-wiring board according to an embodiment of the present invention.

In this embodiment, firstly as shown in FIG. 10A, a double-sided wiring board 111 serving as a fuel passage form layer is prepared to form punched holes 112 as fuel passages by, what is called a router cutting or a laser cutting. The punched holes 112 are formed so as to avoid wiring patterns 111a and 111b respectively provided on both the surfaces of the double-sided wiring board 111. At least one end of the punched hole 112 is formed to face the peripheral edge of the double-sided wiring board 111 to serve as a fuel inlet port or a fuel outlet port. Otherwise, the punched hole 112 may be formed so that its end does not face the peripheral edge of the double-sided wiring board 111. Then, a hole communicating with the punched hole 112 may be formed on any of the wiring boards laminated on the upper and lower sides of the double-sided wiring board 111 to serve as a fuel inlet port or a fuel outlet port. The wiring patterns 111a and 111b provided on both the surfaces of the double-sided wiring board 111 are electrically connected together through holes 111c at required positions.

Figure 10B:
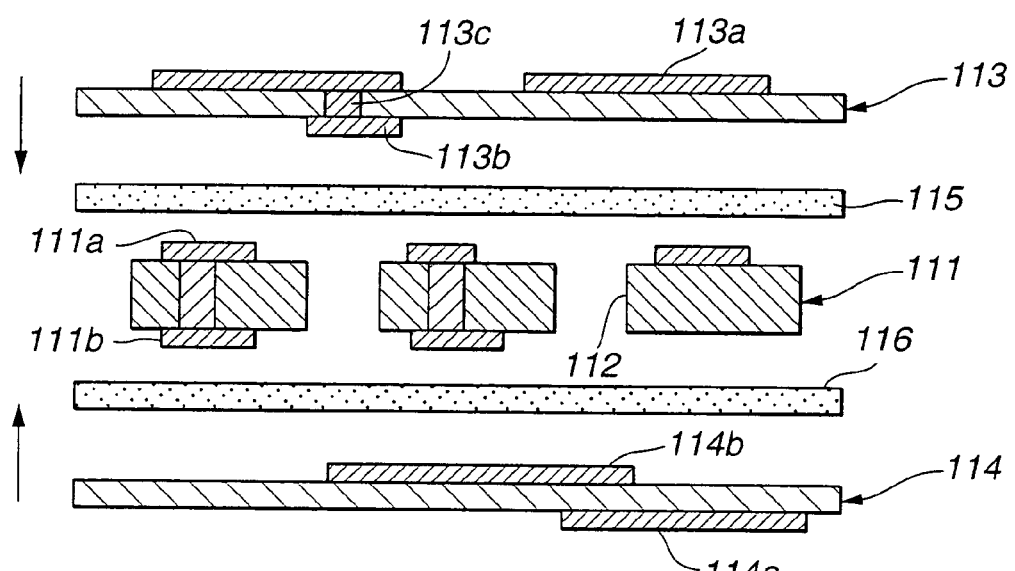

Now, as shown in FIG. 10b, two wiring boards 113 and 114 are prepared and positioned respectively on the surfaces of the double-sided wiring board 111 and superposed on the double-sided wiring board 111 on which the punched holes 112 are formed through adhesive layers 115 and 116. Wiring patterns 113a and 113b or wiring patterns 114a and 114b are also formed on these wiring boards 113 and 114 likewise the above-described double-sided wiring board 111. Respective layers are electrically connected through holes 113c.

Figure 10C:
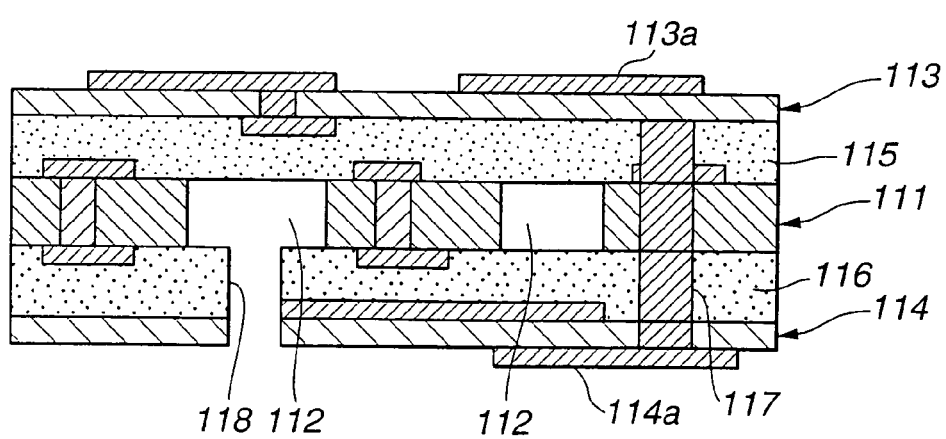

Under this state, a laminated body is pressed. Thus, as shown in FIG. 10C, the printed-wiring board in which the three wiring boards 111, 113 and 114 are formed integrally is obtained. In this printed-wiring board, after the three wiring boards are laminated and integrated, a through hole 117 passing through the three wiring boards 111, 113 and 114 is formed so that an electric connection is realized between these wiring boards 111, 113 and 114. Further, in the wiring board 114, fuel holes 118 are formed at positions corresponding to the punched holes 112 to serve as fuel inlet ports or fuel outlet ports of the punched holes 112 as the fuel passages. The manufactured printed-wiring board has the fuel passages incorporated and is formed as a multi-layer wiring board so that the electric connection and the supply of fuel can be achieved through the printed-wiring boards.

FIGS. 11A to 11E show another embodiment of manufacturing processes of a printed-wiring board. In this embodiment, the use of photolithography technique allows fuel passages to be formed. That is, in this embodiment, as firstly shown in FIG. 11A, a wiring board 121 is prepared. In the wiring board 121, wiring patterns 121a and 121b are formed on each layer of a double sided board or a multi-layer board and these wiring patterns 121a and 121b are electrically connected together through a through hole 121c. A photosensitive resin is applied on one surface of the wiring board 121 to form a photosensitive resin layer 122.

Figure 11A:
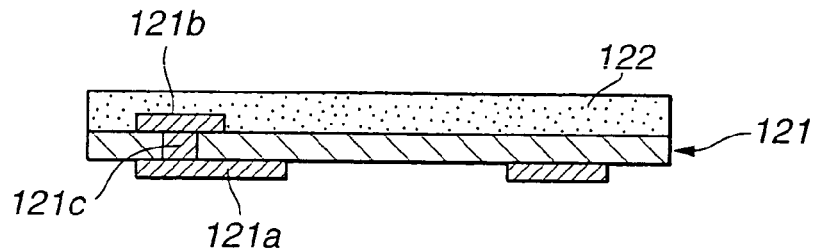
FIGS. 11A to 11E are schematic sectional views showing another example of manufacturing processes of a printed-wiring board according to an embodiment of the present invention.
Figure 11B:
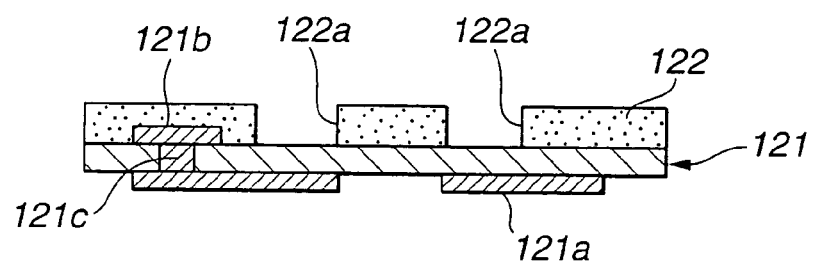

Then, as shown in FIG. 11B, the photosensitive resin layer 122 is patterned in accordance with necessary piping forms to form groove parts 122a serving as fuel passages. The use of ordinary photolithography technique may make it possible to pattern the photosensitive resin layer 122. Specifically, the photosensitive resin layer 122 selectively exposed through a mask and the exposed photosensitive resin layer is developed.

Figure 11C:
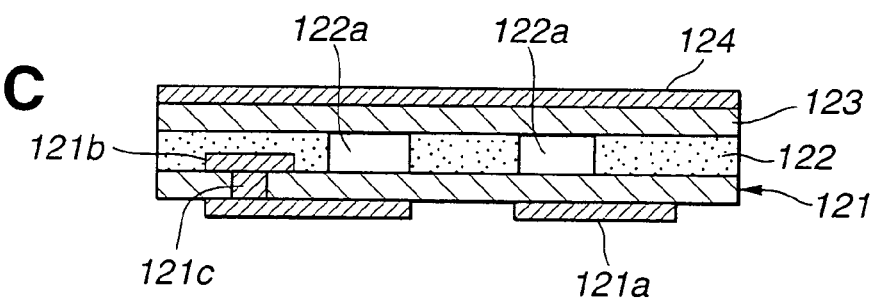

Now, as shown in FIG. 11C, a copper (Cu) foil 124 in which an adhesive layer (resin layer) 123 is formed is superposed on and bonded to the photosensitive resin layer 122. At this time, the thickness of the adhesive layer 123 may be set to arbitrary strength by considering strength. The thickness is preferably small as much as possible. Further, an adhesive having little fluidity is desirably used not to bury the fluid passages. The copper foil 124 having the adhesive layer 123 is laminated so that the groove parts 122a formed on the photosensitive resin layer 122 are closed and the fuel passages are formed.

Figure 11D:
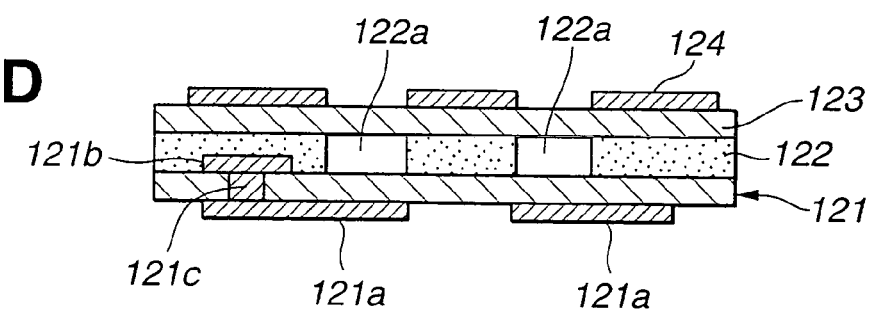

After the above lamination, as shown in FIG. 11D, the copper foil 124 is etched to form a prescribed wiring pattern. The ordinary photolithography technique may be also used to etch the copper foil 124.

Figure 11E:
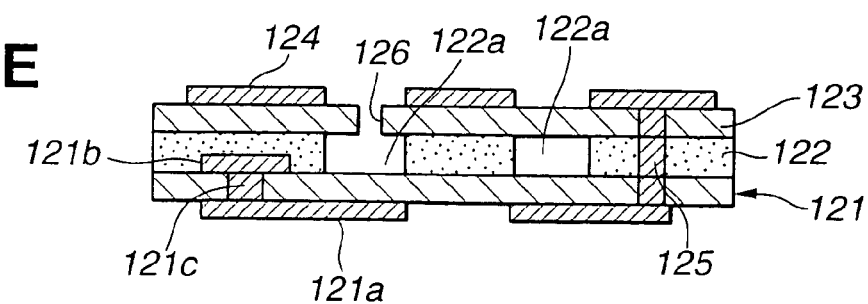

Finally, as shown in FIG. 11E, a through hole 125 is formed to electrically connect the wiring patterns 121a and 121b formed on the wiring board 121 to the wiring pattern formed by etching the copper foil 124. Further, fuel holes 126 communicating with the groove parts 122a formed on the photosensitive resin layer 122 are bored on the wiring board 121 to serve as fuel inlet ports or fuel outlet ports.

FIGS. 12A to 12F show a still another embodiment of a method for manufacturing a printed-wiring board. This embodiment has basically the same processes as those shown in FIGS. 10A to 10C, however, is different from the processes shown in FIGS. 10A to 10C from the viewpoint that the processes of this embodiment more promote a multi-layer structure.

Figure 12A:
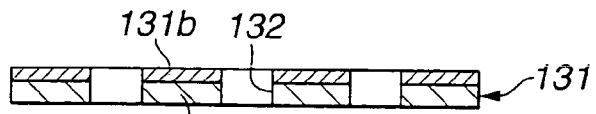
FIGS. 12A to 12F are schematic sectional views showing a still another example of manufacturing processes of a printed-wiring board according to an embodiment of the present invention.

Firstly, as shown in FIG. 12A, a single-sided copper-clad board 131 serving as a fuel passage form layer is prepared and punched holes 132 as fuel passages are formed by what is called a router cutting. A copper foil 131b is bonded to a base material 131a to form the single-sided copper-clad board 131 and the punched holes 132 pass through the base material 131a and the copper foil 131b.

Figure 12B:
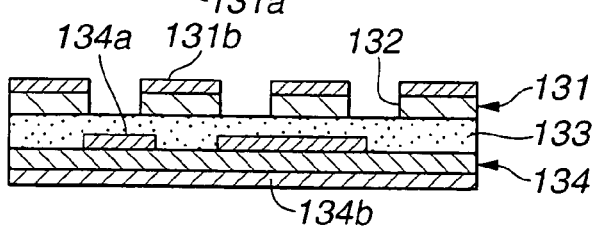

Then, as shown in FIG. 12B, a double-sided wiring board 134 is bonded to the single-sided copper-clad board 131 through an adhesive layer 133. The double-sided wiring board 134 has wiring layers formed on both surfaces. In this step, only one wiring layer on one surface in contact with the adhesive layer 133 undergoes a patterning process to form a wiring pattern 134a and a copper foil 134b on the other surface is not patterned.

Figure 12C:
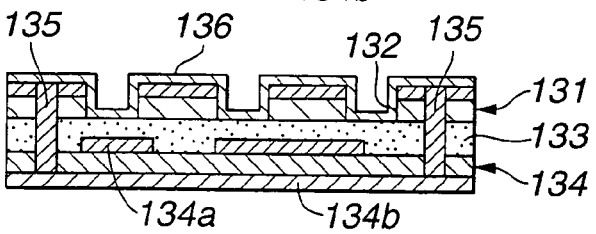
Figure 12D:
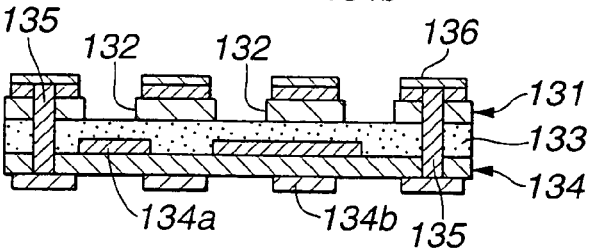

Subsequently, as shown in FIG. 12C, a through hole work is carried out to form through holes 135 passing through the single-sided copper-clad board 131 and the double-sided wiring board 134. Further, a plating process is applied to form the plated through holes and a plated layer 136. This plated layer 136 is formed on an entire surface including the inner parts of the punched holes 132 of the single-sided copper-clad board 131. After the plated layer 136 is formed, as shown in FIG. 12D, the plated layer 136 and the copper foil 134b on the outer part of the double-sided wiring board 134 are patterned in accordance with an electric circuit to respectively form wiring patterns.

Figure 12E:
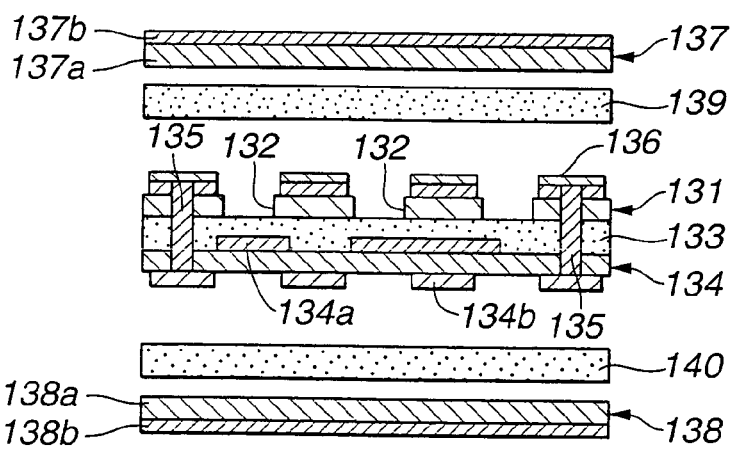
Figure 12F:
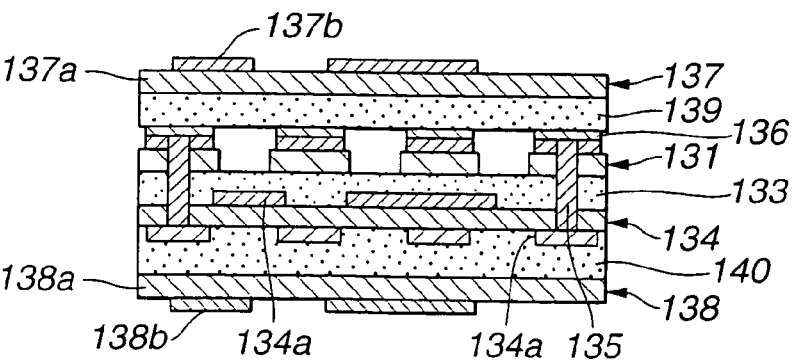

Further, single-sided copper-clad boards 137 and 138 are prepared and bonded to the single-sided copper-clad board 131 and the double-sided wiring board 134 through adhesive layers 139 and 140 as shown in FIG. 12E. Copper foils 137b and 138b are respectively bonded to base materials 137a and 138a to form the single-sided copper-clad boards 137 and 138. The single-sided copper-clad board 137 is superposed on and bonded to the single-sided copper-clad board 131 so that the punched holes 132 are closed and the fuel passages are formed. Finally, the copper coils 137b and 138b as outermost layers are etched to form prescribed wiring patterns and complete the printed-wiring board.

Figure 13:
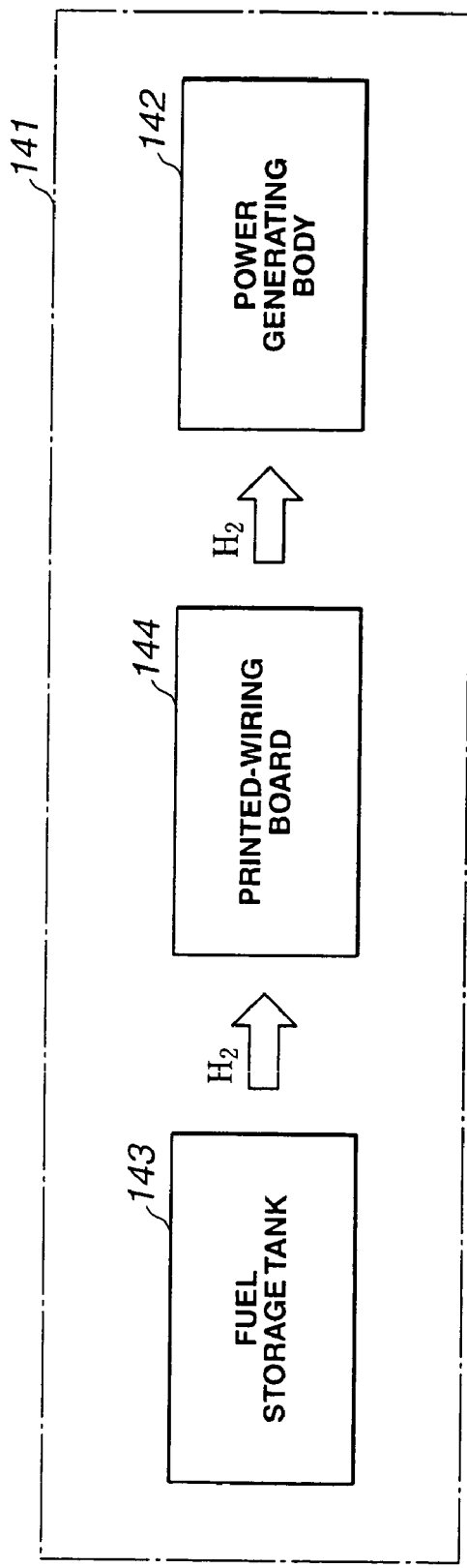
FIG. 13 is a block diagram showing a schematic structure of an electric device having the printed-wiring board incorporated according to an embodiment of the present invention.

The printed-wiring board according to an embodiment of the present invention is mounted and used on various types of electric devices, especially in electric devices in which a fuel cell is incorporated. FIG. 13 shows one example of a form that the printed-wiring board according to the present invention is incorporated in the electric device. In this example, a power generator 142 of a fuel cell and a fuel storage tank 143 are incorporated in an electric device main body 141. Electric power is supplied to a driving circuit part contained in the electric device main body 141 by the electromotive force of the power generator 142. Here, a printed-wiring board 144 in which fuel passages are incorporated is mounted on the electric device main body 141. Fuel (hydrogen) used for a cell reaction in the power generator of the fuel cell is supplied to the power generator 142 from the fuel storage tank 143 through the fuel passages of the printed-wiring board 144.

In the electric device in which the power generator 142 of the fuel cell is incorporated as described above, when the printed-wiring board 144 in which the fuel passages are incorporated is mounted and hydrogen as fuel is supplied to the power generator 142 from the fuel storage tank 143, the power generator 142 and the fuel storage tank 143 can be freely arranged. Thus, a restriction in design can be lightened and the device can be miniaturized. Particularly, the printed-wiring board 144 according to an embodiment of the present invention is mounted as a circuit board of the power generator 142 and used as the fuel passages so that the structure can be simplified and the number of assembly steps can be reduced. When a fuel connection between the power generator 142 and the fuel storage tank 143 is carried out, piping parts such as tubes do not need to be pulled around and the number of parts can be reduced.

Figure 14:
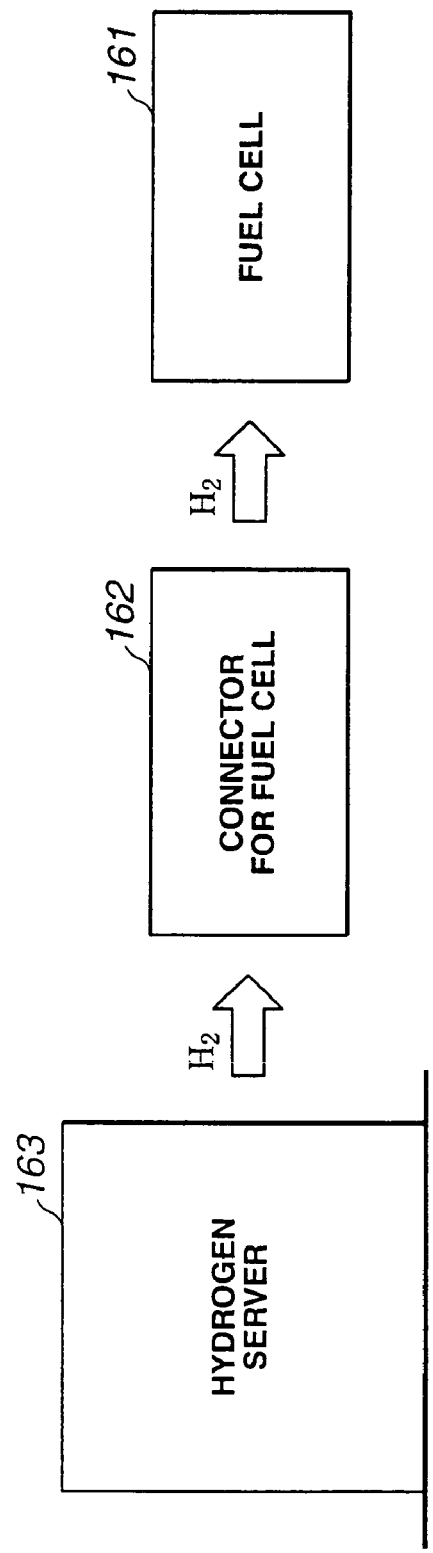
FIG. 14 is a block diagram showing one example of a using form of a connector for a fuel cell according to an embodiment of the present invention.

The above-described printed-wiring board in which the fuel passages are incorporated can be used not only as the circuit board of the electric device, but also as a connector for a fuel cell. The concept of a using form as a connector for a fuel cell is shown in FIG. 14. In this embodiment, when fuel (hydrogen) needs to be supplied to a fuel cell 161, the fuel cell 161 is connected to a fuel server (hydrogen server) 163 through a connector 162 for a fuel cell having the printed-wiring board incorporated to supply the fuel (hydrogen). The printed-wiring board is interposed between the fuel server and the fuel cell so that not only the hydrogen as fuel can be supplied and received, but also information about, for instance, the delivery of the fuel can be transmitted by an electric signal.

Figure 15:
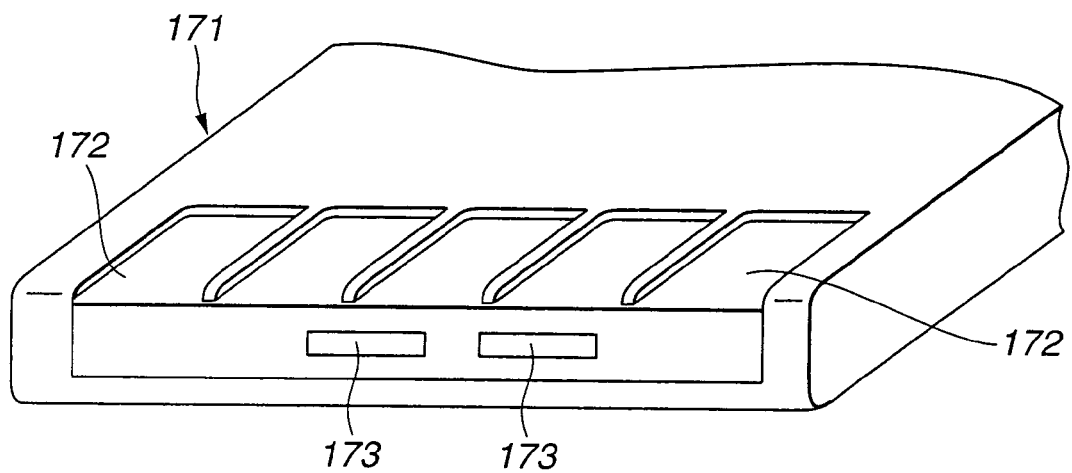
FIG. 15 is a schematic perspective view of main parts showing an example of a configuration of the connector for the fuel cell according to an embodiment of the present invention.

As another embodiment of a connector for a fuel cell, the connector can be used as a hydrogen delivery connector having hydrogen contained. For example, as shown in FIG. 15, the printed-wiring board is directly used as a connector in a hydrogen delivery device 171 having such a form as a memory module employed in a personal computer or the like. In this embodiment, electric contacts 172 of the incorporated printed-wiring board are directly used as the electric contacts of the hydrogen delivery device 171. At the same time, fuel passages 173 incorporated in the printed-wiring board face an outer part in this connector part and serve as joints for fuel piping. In this case, the delivery of the electric signal and the hydrogen as fuel can be carried out at the same time through the connector using the printed-wiring board.

Figure 16:
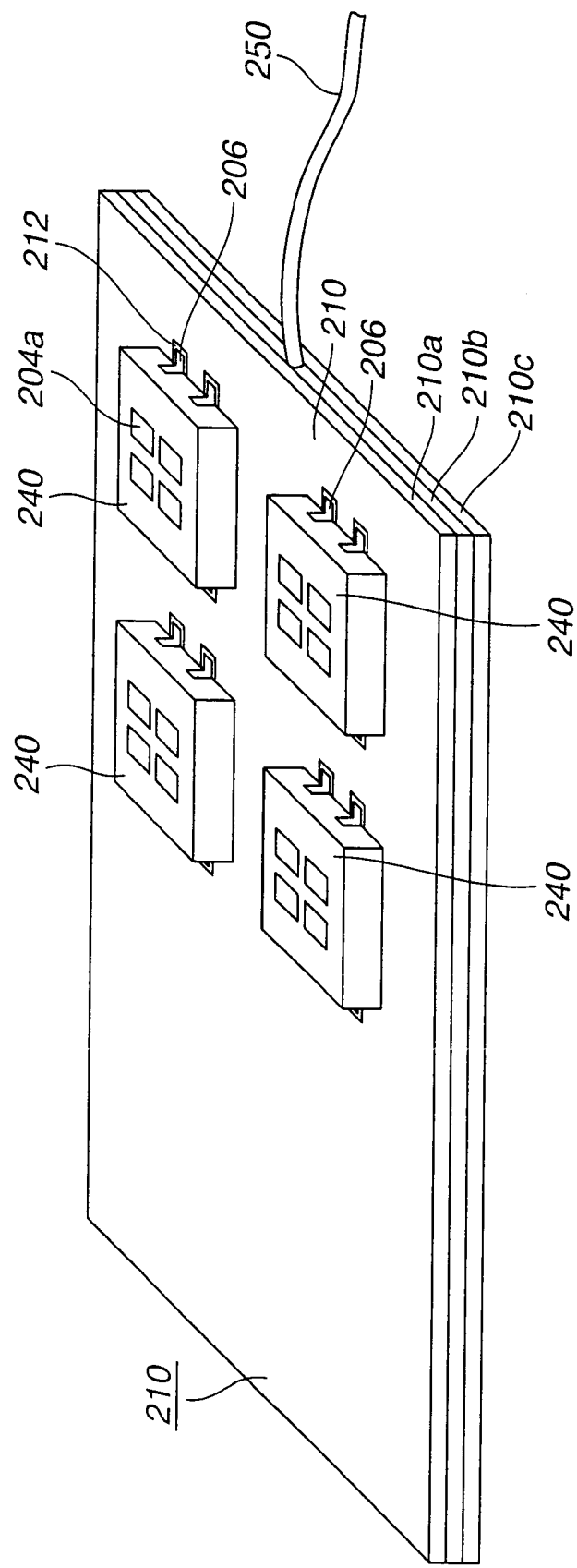
FIG. 16 is a schematic perspective view showing the entire structure of the fuel cell according to an embodiment of the present invention.

Now, the fuel cell and the printed-wiring board according to an embodiment of the present invention and a method for connecting them will be described in detail by referring to the drawings. FIG. 16 schematically shows an embodiment of the present invention. In this embodiment, a number of fuel cells 240 are mounted on a printed-wiring board 210. A fuel supply tube 250 is connected to the printed-wiring board 210 to supply fuel to the fuel cells 240 from the fuel supply tube 250 through the printed-wiring board 210. Air is taken from air intake ports 204a to supply electric current generated by the fuel cells 240 to electronic parts disposed in parts except the printed-wiring board 210 or drive an electric circuit formed on the printed-wiring board 210.

FIGS. 17A to 17C shows one embodiment of a fuel cell 241 according to an embodiment of the present invention. This embodiment uses a surface-mount type package called a small outline package (SOP). In this embodiment, one or two or more power generators 203 are held and incorporated between an upper housing 201 and a board side housing 202. Air is supplied to a cathode side of the power generator 203 from air intake ports 204b provided in the upper housing 201. Fuel such as hydrogen, methanol, or the like is supplied to an anode side of the power generator 203 from fuel joints 205 as tubular fuel passages attached to the surface (referred it to as a wiring member mount surface, hereinafter) of the board side housing 202 which is opposed to a printed-wiring board 210 to generate power.

A plurality of terminal pins 206a and 206b connected to anodes (fuel electrodes) or cathodes (air electrodes) of the power generators 203 are drawn out from the upper housing 201 and the board side housing 202. An electric connection to the printed-wiring board 210 is carried out through the terminal pins 206a and 206b.

That is, the fuel cell 241 having a structure shown in FIGS. 17A to 17C is mounted on the printed-wiring board 210 provided in an electric device in the following manner. That is, the terminal pins 206a and 206b are inserted into or allowed to come into contact with connecting terminals provided on the printed-wiring board 210 incorporated in the electric device side to solder them and mount the fuel cell on the printed-wiring board. Thus, the electrodes of the fuel cell 241 are electrically connected to wiring formed on the printed-wiring board 210 so that electric power is supplied to the circuit of the electric device side.

Figure 18:
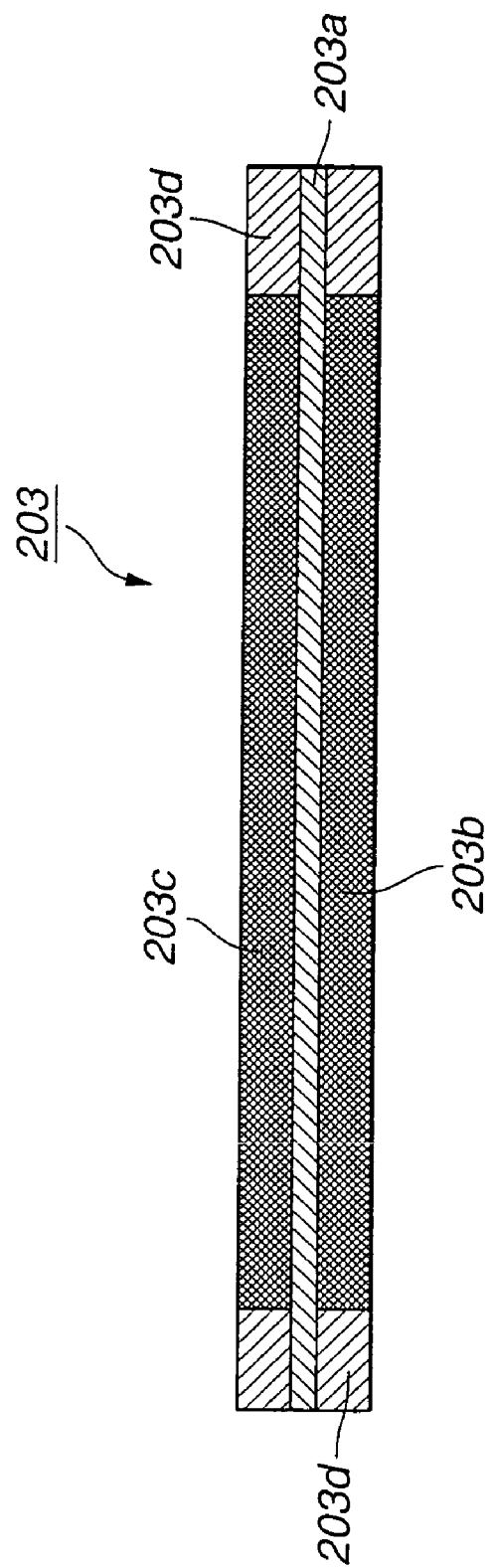
FIG. 18 is a schematic sectional view showing one structural example of a power generator according to an embodiment of the present invention.

Each power generator 203 has a structure that an ion conductive film 203a is held at both sides between an anode 203b and a cathode 203c as a pair of electrodes and peripheries thereof are sealed with seals 203d, as shown in FIG. 18. This seal 203d is provided for the purpose of preventing hydrogen from leaking to the cathode side 203c. The seal 203d may be formed by bonding together materials which are previously formed by an injection molding or punching, or the like or may be directly formed on the ion conductive film 203a or the electrodes.

Figure 19:
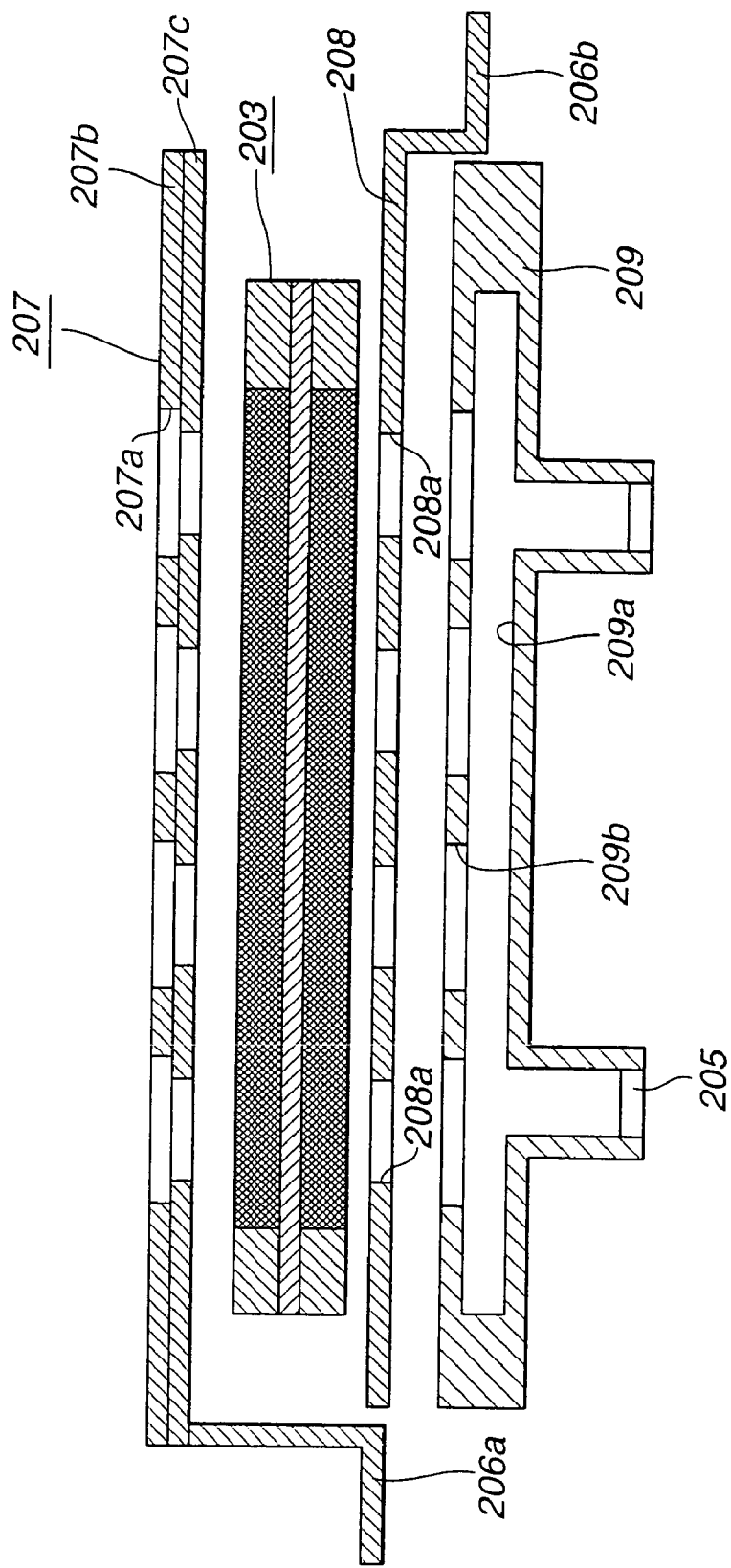
FIG. 19 is a schematic sectional view showing a disassembled state of the fuel cell shown in FIG. 17 according to an embodiment of the present invention.

FIG. 19 shows a state that the fuel cell 241 shown in FIGS. 17A to 17C is disassembled. The fuel cell 241 of this embodiment has a structure that the power generator 203 shown in FIG. 18 is sandwiched in between a pair of current collectors 207 and 208. The current collectors 207 and 208 respectively have opening parts 207a and 208a provided respectively for taking fuel. Hydrogen as fuel and oxygen (air) are taken into the anode 203b and the cathode 203c through these opening parts 207a and 208a.

The current collector 207 of the cathode 203c side has a two-layer structure. The structure includes an insulating material layer 207b made of an insulating material in an exposed side as the surface of the upper housing 201 and a current collecting part 207c made of a conductive material in a side coming into contact with the power generator 203. The current collector 208 of the anode 203b side is made of a conductive material, and is not especially provided with such an insulating material layer as that provided in the current collector 207 of the cathode 203c side. Here, as the conductive material which forms the current collecting part 207c of the current collector 207 in the cathode 203c side or the current collector 208 of the anode 203b side, a metallic plate, a carbon sheet or the like may be used. In addition thereto, what is called a single-sided board that a conductive layer is formed on a polymer film, a glass epoxy board, a ceramic board, and/or the like may be used. Otherwise, a paste printing or plating may be applied to the power generator 203 to directly form a current collecting layer thereon.

The current collecting part 207c of the current collector 207 or the current collector 208 is electrically connected respectively to the terminal pins 206a and 206b through which an electric connection to the electric device is achieved. The ends of the terminal pins 206a and 206b are desirably have forms, for instance, thin plate shapes or pin shapes so as to be inserted into or come into contact with the connecting terminals provided in the printed-wiring board 210. Further, the ends of the terminal pins 206a and 206b desirably have such a rigidity as to be fixed to the printed-wiring board 210. When the current collecting part 207c of the current collector 207 or the current collector 208 is made of the metallic plate, the ends of the terminal pins 206a and 206b are machined to the thin plate shapes or pin shapes, so that they may be provided integrally. The terminal pins 206a and 206b may be separately provided and they may be mechanically and electrically connected to the current collecting part 207c of the current collector 207 or the current collector 208.

In the outside of the current collector 208 of the anode side, a hydrogen supply part 209 having a passage 209a for hydrogen as fuel fluid is arranged and a fuel joint 205 is fixed thereto. Further, in the hydrogen supply part 209, opening parts 209b opposed to the opening parts 208a provided in the current collector 208 are provided. Accordingly, the fuel fluid such as hydrogen is supplied to the anode 203b of the power generator 203 through the passage 209a, the opening parts 209b and the opening parts 208a from the fuel joint 205. The fuel joint 205 may be formed as one part, or may be formed integrally with the fuel supply part 209, the current collector 208 or the board side housing 202.

Figure 20:
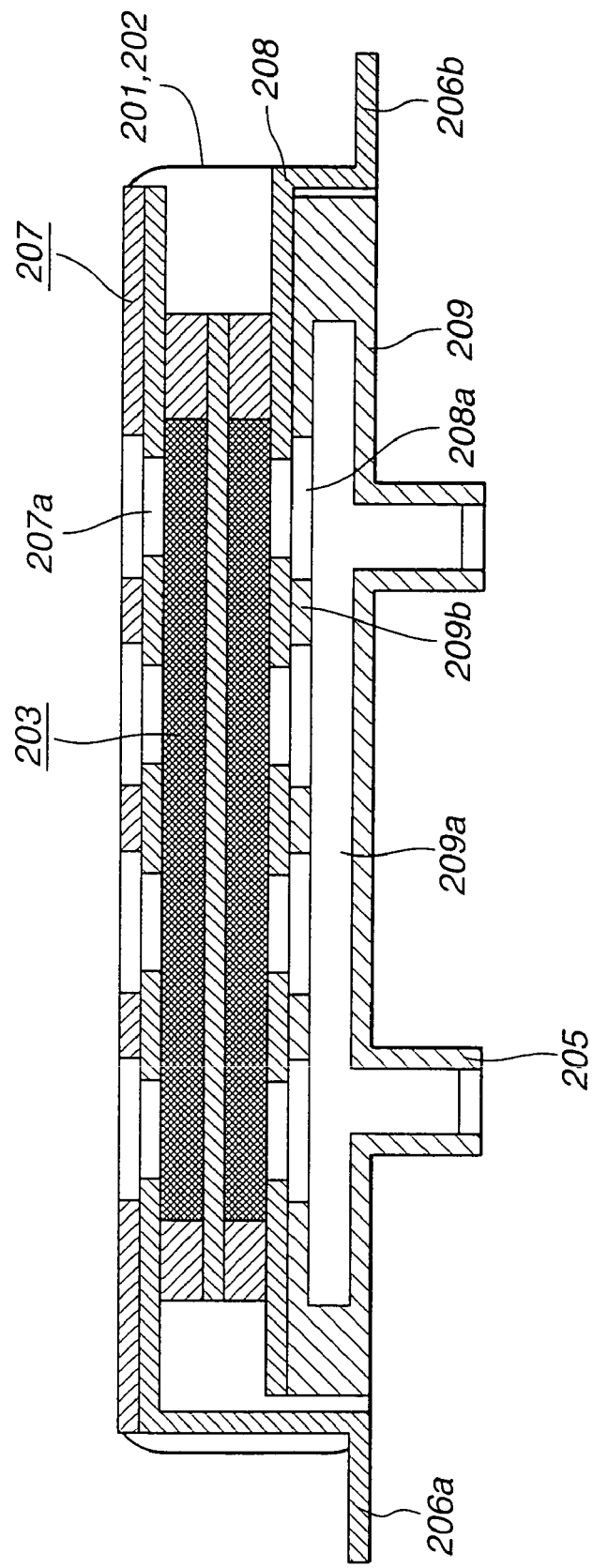
FIG. 20 is a schematic sectional view showing an assembled state of the fuel cell shown in FIG. 17 according to an embodiment of the present invention.

The above-described components, that is, the power generator 203, the fuel joints 205, the current collectors 207 and 208, and the hydrogen supply part 209 are superposed together to have a laminated body. Then, these components are fixed together by sandwiching them in between the upper housing 201 and the board side housing 202 and bonding them to have a packaged body as shown in FIG. 20. In this embodiment, the housing is divided into upper and lower parts and the laminated body is sandwiched in between these housings and fixed by an adhesive. However, it is to be understood that variety of structures other than this structure may be employed. For instance, a packaging of the laminated body may be carried out simultaneously with a formation of the housing by a resin mold to form the housing integrally with the laminated body. In addition, a structure that the upper and lower housings are fixed by screwing or a structure that the upper and lower housing parts are fixed by an ultrasonic welding or the like may be employed.

In the fuel cell having the above-described structures, when the hydrogen as fuel is allowed to enter the hydrogen supply part 209 from the fuel joints 205 so as to come into contact with the anode 203b and air (oxygen) is allowed to enter from the opening parts 207a so as to come into contact with the cathode 203c, a reaction represented by the following reaction formula is generated in the anode 203b side.

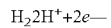

In the cathode 203c side, a reaction represented by a reaction formula described below is generated.

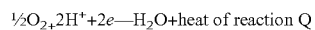

In the entire part, a reaction represented by $H_2 + \frac{1}{2}O_2 \; H_2O$ is generated. That is, in the anode 203b side, hydrogen discharges an electron to become a proton that passes through the ion conductive film 203a to move to the cathode 203c side and receives the supply of the electron in the cathode 203c to react with oxygen. An electromotive force is obtained in accordance with such an electrochemical reaction.

Figure 21C:
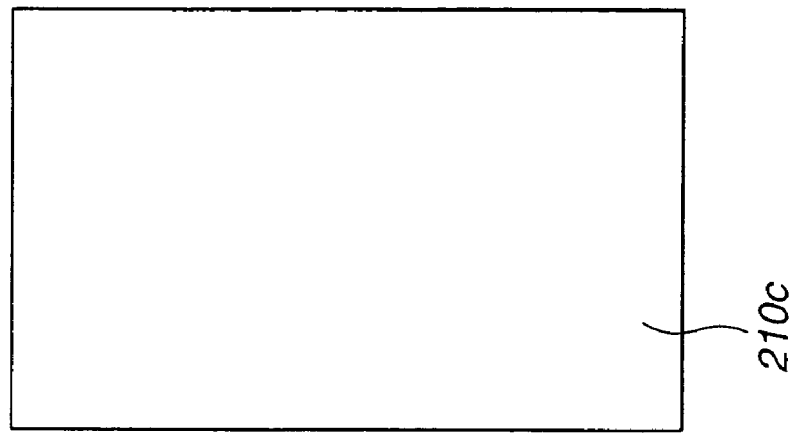
FIGS. 21A to 21C respectively show each layer of the structure of the printed-wiring board according to an embodiment of the present invention.
Figure 21B:
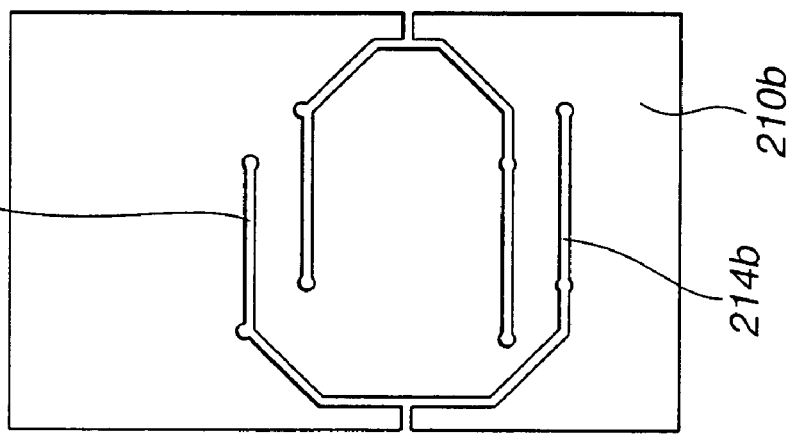
Figure 21A:
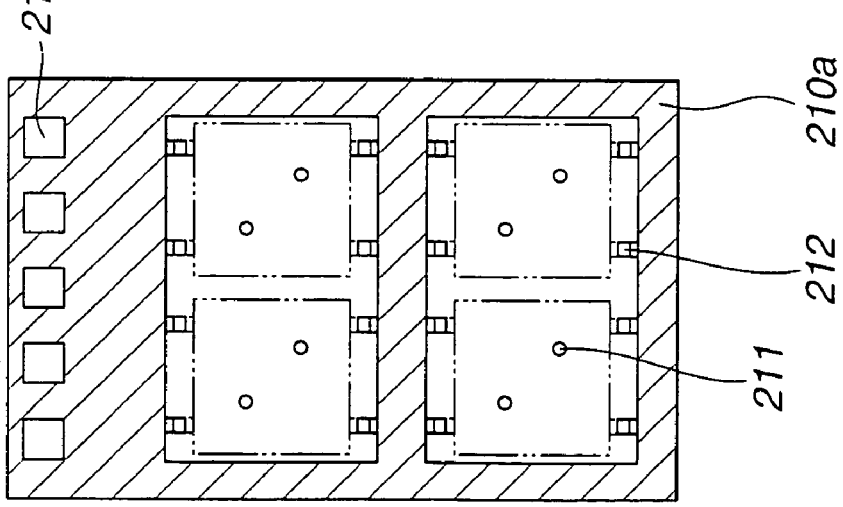

FIGS. 21A to 21C show plan views showing the structure of the printed-wiring board 210 shown in FIG. 16. The printed-wiring board 210 is what is called a glass epoxy board that glass fibers are impregnated with an epoxy resin. The printed-wiring board 210 has a three-layer structure including an upper layer 210a, an inner layer 210b and a lower layer 210c. In the upper layer 210a, connecting terminals 212 for an electric connection to fuel supply ports 211 as opening parts are formed so as to correspond to positions where the above-described fuel cells 240 are mounted. That is, the fuel supply ports 211 are formed at positions suitably connected to the fuel joints 205 formed in the fuel cells 240. The connecting terminals 212 are formed at positions corresponding to the terminal pins 206a and 206b formed in the fuel cells 240.

Although the example that the printed-wiring board 210 is the glass epoxy board is described, such a wiring member as described below may be employed. This wiring member has wiring for electrically connecting together electronic parts such as a semiconductor device, a fuel cell, or the like and a mechanical strength with which fuel does not leak under atmospheric pressure. Further, what is called an inorganic substrate in which an inorganic material such as glass, ceramics, or the like is used as a substrate member and wiring is applied thereon or a flexible substrate with a flexibility using polyimide, PET, or the like may be used. Further, tubular fuel passages may be embedded in a sheet or a plate shaped wiring member to form a printed-wiring board.

On the upper layer 210a, an electric device 213 on which printed wiring not shown is applied is mounted, or the terminals for mounting the electric device 213 are formed. The printed wiring is connected to each of the connecting terminals 212 to drive the electric device 213 under voltage generated by the mounted fuel cells 241. The printed wiring, the fuel supply ports 211 and the connecting terminals 212 are manufactured by the same method as a method for forming an ordinary printed board.

On the inner layer 210b, fuel passages 214a and 214b are formed through positions corresponding to the fuel supply ports 211 by a milling, an embossing, a routing, etc. The fuel passages 214a and 214b may pass through both the surfaces of the inner layer 210b or may be formed in shapes of grooves with one surface left. In this case, a sectional area capable of adequately supplying fuel needs to be ensured. At positions corresponding to the fuel supply ports 211, the fuel passages 214a and 214b are desirably formed in a range wider than the diameter of the fuel supply port 211 by considering a dislocation upon laminating process. When the fuel is supplied, the fuel supply tube 250 shown in FIG. 16 is connected to the fuel passages 214a and 214b so that the fuel enters the fuel passages 214a and 214b from the fuel supply tube 250.

The lower layer 210c is made of a plate shaped synthetic resin and covers the fuel passages 214a and 214b formed on the inner layer 210b from a surface opposite to the upper layer 210a to prevent the leakage of fuel from the fuel passages 214a and 214b.

Figure 22:
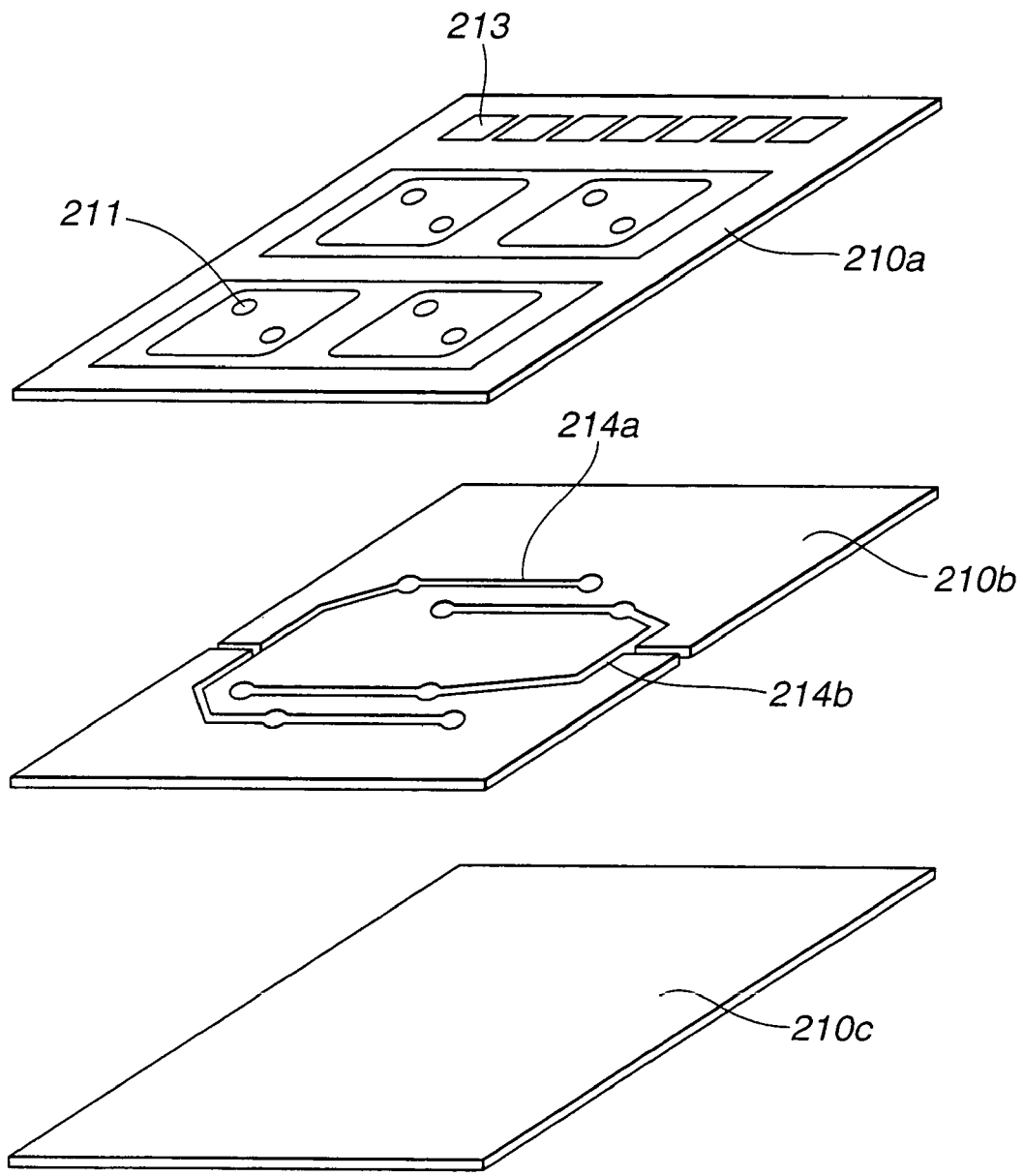
FIG. 22 is a perspective view showing a combination of the printed-wiring board according to an embodiment of the present invention.

FIG. 22 is a perspective view showing a positional relation when the above-described upper layer 210a, the inner layer 210b and the lower layer 210c are combined and bonded together to form the printed-wiring board 210. The upper layer 210a, the inner layer 210b and the lower layer 210c are bonded together by an adhesive. At this time, the fuel support ports 211 formed on the upper layer 210a are located so as to be opposed to the fuel passages 214a and 214b formed on the inner layer 210b. Here, although the three-layer structure is described, the inner layer 210b may be formed while the inner layer 210b is formed integrally with the lower layer 210c. Further, when the printed-wiring board having a multi-layer wiring structure is formed, layers may be increased and wiring may be properly provided respectively between the layers.

Figure 23A:
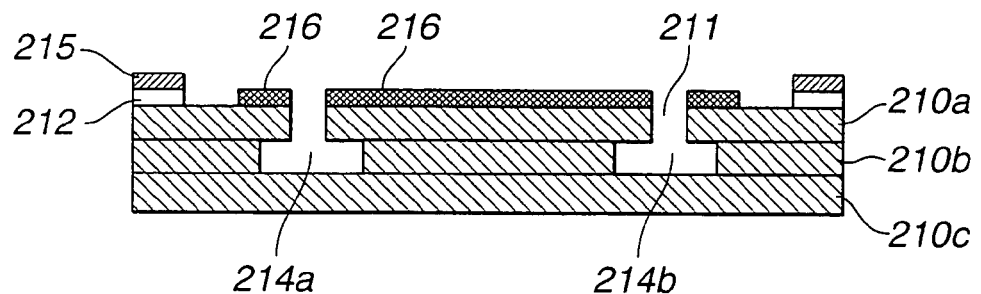
FIGS. 23A to 23C show steps for mount the insertion-mount type fuel cell on the printed-wiring board according to an embodiment of the present invention.
Figure 23B:
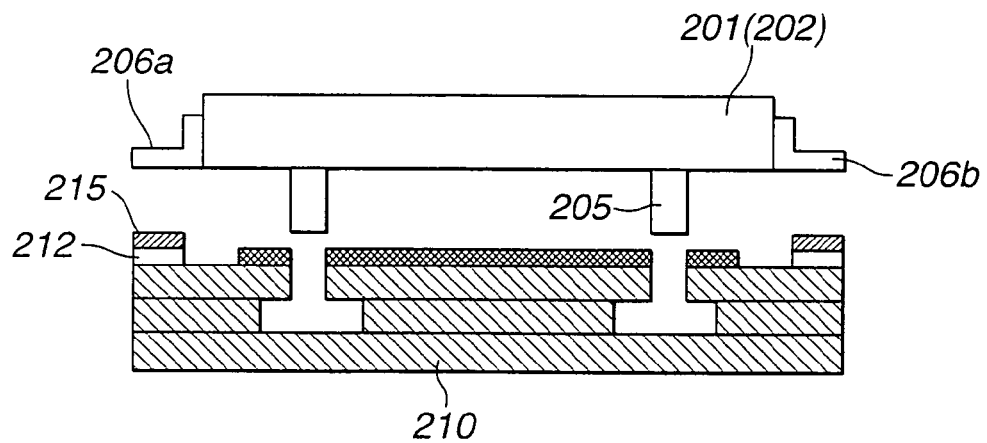
Figure 23C:
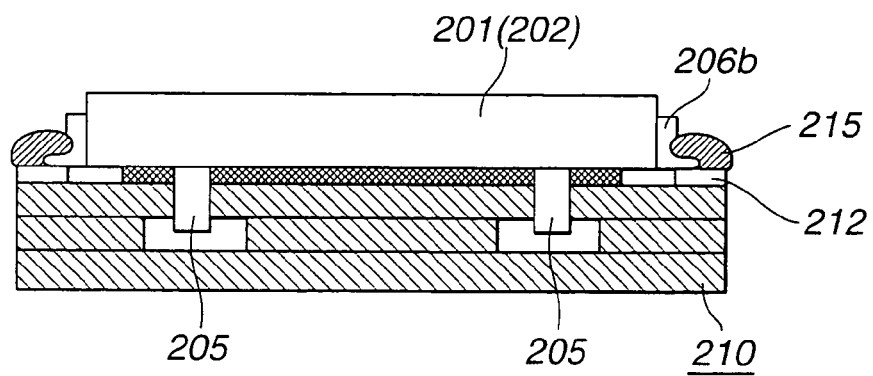

FIGS. 23A to 23C are sectional views showing steps for mounting the fuel cell 241 shown in FIG. 20 on the printed-wiring board 210. A conductive agent 215 is printed on the connecting terminals 212 of the printed-wiring board 210 in which the upper layer 210a, the inner layer 210b and the lower layer 210c are bonded together and formed integrally by an adhesive or the like. As the conductive agent 215, cream solder or conductive paste may be exemplified. Any material may be employed which has a curing property after printed at a prescribed position as well as an electric conductivity for ensuring an electric connection between the terminal pins 206a and 206b and the connecting terminals 212. At this time, the ion conductive film 203a of the fuel cell 241 is made of a material having a low heat resistance, a cold setting type conductive agent 215 is used. Further, in an area on which the fuel cell 241 is mounted in the vicinity of the fuel supply ports 211 formed on the surface of the upper layer 210a, an adhesive 216 is laminated (see FIG. 23A). Here, as the adhesive 216, a thermoplastic adhesive sheet made of polyester resin or the like may be exemplified. Any material by which the printed-wiring board 210 can be bonded to the fuel cell 241 may be employed. Further, a material that can maintain an air-tightness under atmospheric pressure or the like after it is cured is desirably used.

The terminal pins 206a and 206b of the fuel cell 241 are positioned on the positions of the connecting terminals 212 and the fuel joints 205 are positioned on the positions of the fuel supply ports 211 and the fuel passages 214a and 214b. Thus, the fuel joints 205 are inserted into the fuel supply ports 211 to mount the fuel cell 241 on the printed-wiring board 210. At this time, pressure is suitably applied (see FIG. 23B). Thus, the terminal pins 206a and 206b of the fuel cell 241 adequately come into contact with the conductive agent 215 and the wiring member mounting surface of the board side housing 202 adequately comes into contact with the adhesive 216.

After the fuel cell 241 is mounted on the printed-wiring board 210, a reflowing process is carried out to cure the conductive agent 215, solder them and electrically connect the wiring provided on the printed-wiring board 210 to the fuel cell 241. At this time, the adhesive 216 is also cured simultaneously to stick the fuel cell 241 to the printed-wiring board 210. When temperature conditions under which the conductive agent 215 and the adhesive 216 are cured are different from each other, they are respectively cured at two-stage setting temperature. The adhesive 216 is sandwiched in between the board side housing 202 and the printed-wiring board 210 so that the fuel can be sealed between the fuel joints 205, the fuel supply ports 211 and the fuel cell 241 to prevent the leakage of the fuel (see FIG. 23C).

Figure 24A:
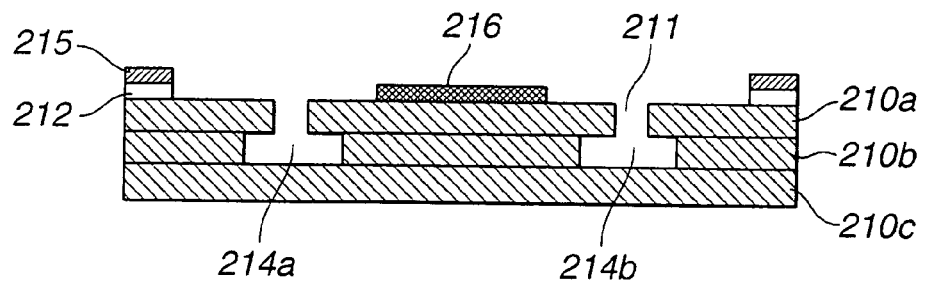
FIGS. 24A to 24C show steps of another embodiment for mount a fuel cell on a printed-wiring board according to an embodiment of the present invention.
Figure 24B:
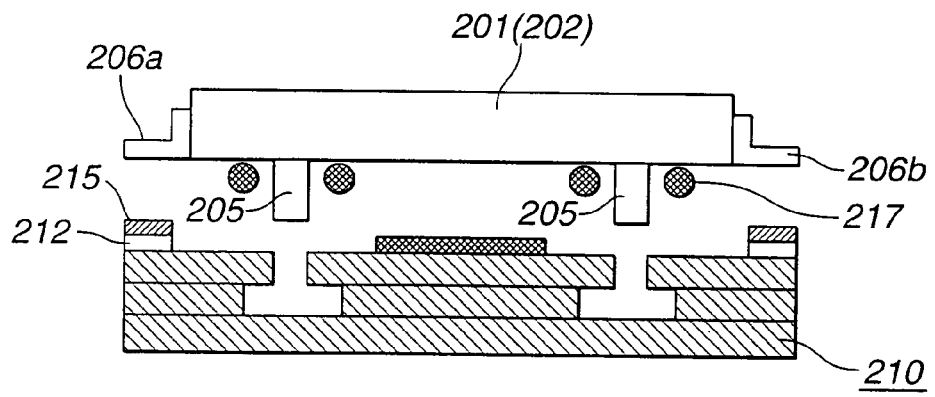
Figure 24C:
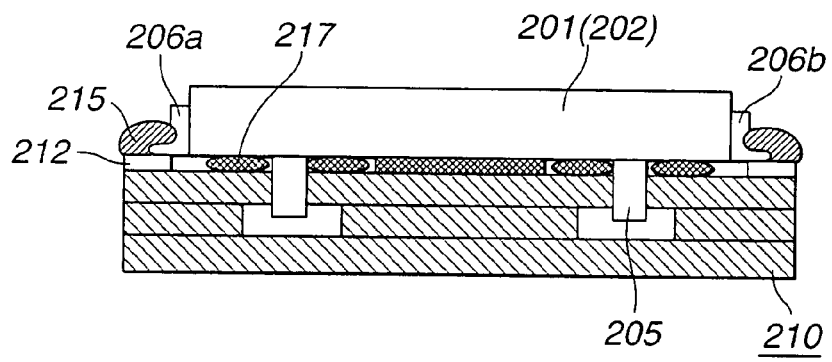
Figure 25:
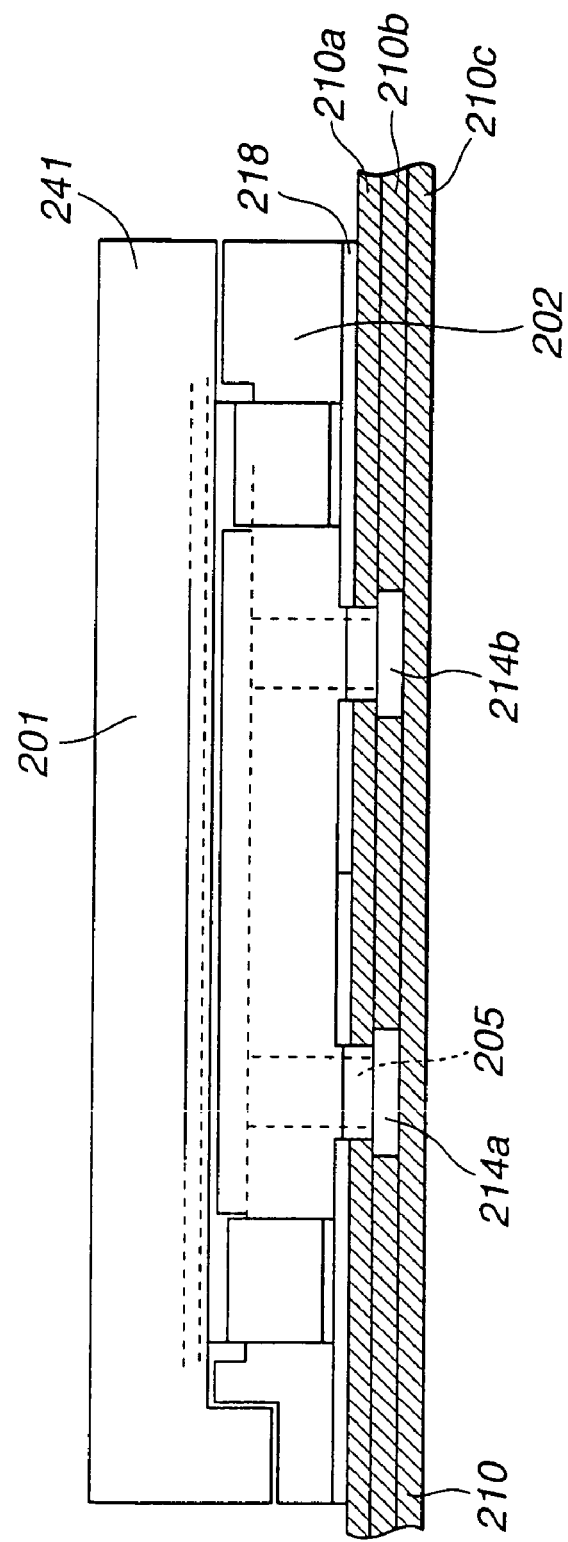
FIG. 25 shows a state that the insertion-mount type fuel cell is mounted on the printed-wiring board to seal with a resin for enhancing an air-tightness according to an embodiment of the present invention.

FIGS. 24A to 24C show another embodiment of steps for mounting a fuel cell 241 on a printed-wiring board 210. An upper layer 210a, an inner layer 210b and a lower layer 210c are bonded together and formed integrally by an adhesive or the like. A conductive agent 215 is printed on the connecting terminals 212of the integrally formed printed-wiring board 210. At this time, the ion conductive film 203a of the fuel cell 241 is made of a material having a low heat resistance, a cold setting type conductive agent 215 is used. Further, in a part of an area of the surface of the upper layer 210a on which the fuel cell 241 is mounted, a thermoplastic adhesive 216 is laminated (see FIG. 24A).

The terminal pins 206a and 206b of the fuel cell 241 are positioned on the positions of the connecting terminals 212 and fuel joints 205 are positioned on the positions of fuel supply ports 211 and fuel passages 214a and 214b. Thus, the fuel cell 241 is mounted on the printed-wiring board 210 so that the fuel joints 205 are connected to the fuel supply ports 211. In the peripheries of the fuel joints 205, airtight members 217 for holding air-tightness such as O-rings or fuel sockets are arranged to hold the airtight members 217 between the printed-wiring board 210 and the fuel cell 241. At this time, pressure is suitably applied (see FIG. 24B). Thus, the terminal pins 206a and 206b adequately come into contact with the conductive agent 215 and the wiring member mounting surface of a board side housing 202 adequately comes into contact with the adhesive 216. Accordingly, the airtight member 217 allows the air-tightness between the surface of the printed-wiring board 210 and the wiring member mounting surface of the fuel cell 241 to be maintained.

After the fuel cell 241 is mounted on the printed-wiring board 210, a reflowing process is carried out to cure the conductive agent 215, solder them and electrically connect the wiring provided on the printed-wiring board 210 to the fuel cell 241. At this time, the adhesive 216 is also cured simultaneously to stick the fuel cell 241 to the printed-wiring board 210. When temperature conditions under which the conductive agent 215 and the adhesive 216 are cured are different from each other, the conductive agent and the adhesive are respectively cured at two-stage setting temperature. The airtight members 217 are sandwiched in between the board side housing 202 and the printed-wiring board 210. Thus, the fuel can be sealed between the surface of the printed-wiring board 210 and the wiring member mounting surface of the fuel cell 241 to prevent the leakage of the fuel (see FIG. 24C).

In order to more improve the air-tightness between the printed-wiring board 210 and the fuel cell 241, a sealing resin 218 such as a epoxy resin is injected into clearances between the printed-wiring board 210 and the fuel cell 241 and heat-treated. Thus, the sealing resin 218 is cured to realize resin sealing. The fuel cell 241 is securely fixed to the printed-wiring board 210 by the resin sealing to seal the fuel between the fuel joints 205, the fuel supply ports 211 and the fuel cell 241 and prevent the leakage of the fuel. As the sealing resin 218, a thermoplastic resin is used so that the fuel cell may be reworked and easily repaired and parts may be easily changed.

As described above, the fuel supply tube 250 shown in FIG. 16 is connected to the fuel passages 214a and 214b provided on the printed-wiring board 210 and the fuel such as hydrogen is injected to the printed-wiring board 210 from the fuel supply tube 250. Then, the fuel enters the fuel passages 214a and 214b of the inner layer 210b and reaches the fuel supply ports 211 provided in the upper layer 210a. The fuel reaching the fuel supply ports 211 enters the fuel supply part 209 through the fuel joints 205 to supply the fuel to the power generator 203.

As described above, in the power generator 203, hydrogen discharges the electron in the anode 203b side to become a proton. The proton passes through the ion conductive film 203a and moves to the cathode 203c side and receives the supply of an electron to react with oxygen and produce water in the cathode 203c side. In such a way, the fuel can be continuously supplied to the fuel cell 241 mounted on the surface through the fuel passages provided on the printed-wiring board 210. Here, the example that the fuel is supplied to the fuel joints 205 from the two systems of the fuel passages 214a and 214b is illustrated above. However, such a design as to supply fuel from one system or more systems is made depending on the size or the form of the fuel cell 241, a flow rate allowable by the fuel passages 214, etc.

Now, a still another embodiment of a fuel cell according to the present invention will be described. A fuel cell 242 according to this embodiment utilizes a surface-mount type package form called a BGA (Ball Grid Array).

Figure 26A:
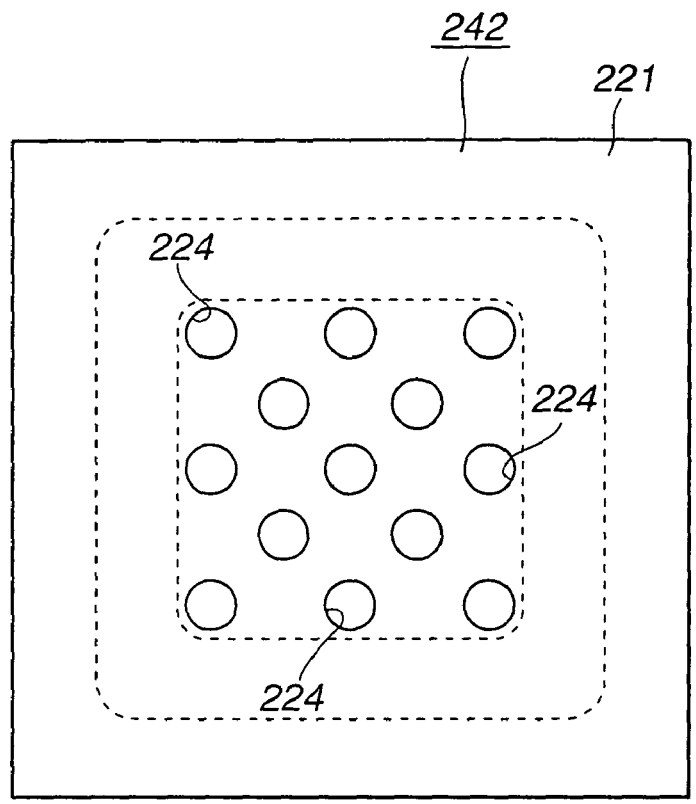
FIG. 26A is a plan view showing one example of a fuel cell having a surface-mount type package structure according to an embodiment of the present invention.
Figure 26C:
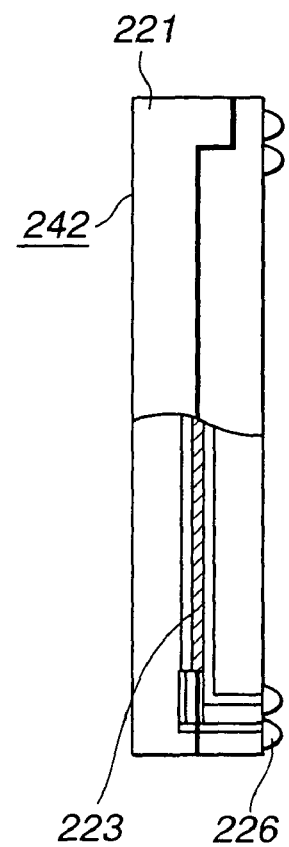
FIG. 26C is a partly sectional view thereof according to an embodiment of the present invention.
Figure 26B:
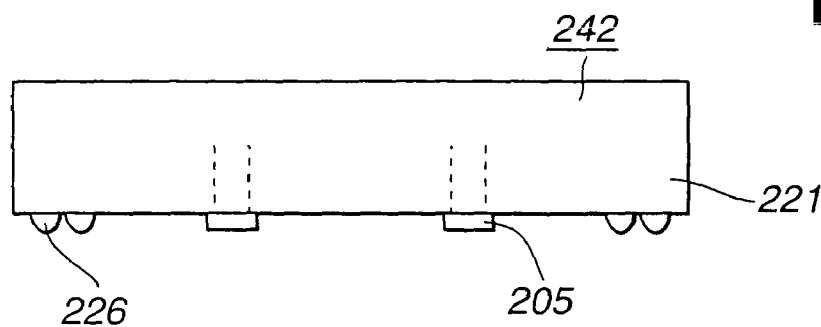
FIG. 26B is a side view thereof.

The basic structure of the fuel cell 242 of this embodiment is the same as that of the above-described embodiment. As shown in FIGS. 26A to 26C, a power generator 223 is contained in a housing 221. Air is supplied to a cathode side from air intake ports 224 provided in the housing 221 and fuel (hydrogen) is supplied to an anode side from tubular fuel joints 225 likewise attached to the housing 221 to generate electric power.

An electric connection to an electric device is carried out through terminals 226. Here, the terminals 226 are formed in the shapes of balls such as what is called solder bumps or protrusions made of a conductive material such as solder differently from those of the above-described embodiment. The terminals 226 are mechanically and electrically connected to connecting terminals 212 formed on a printed-wiring board 210 of the electric device side.

Figure 27:
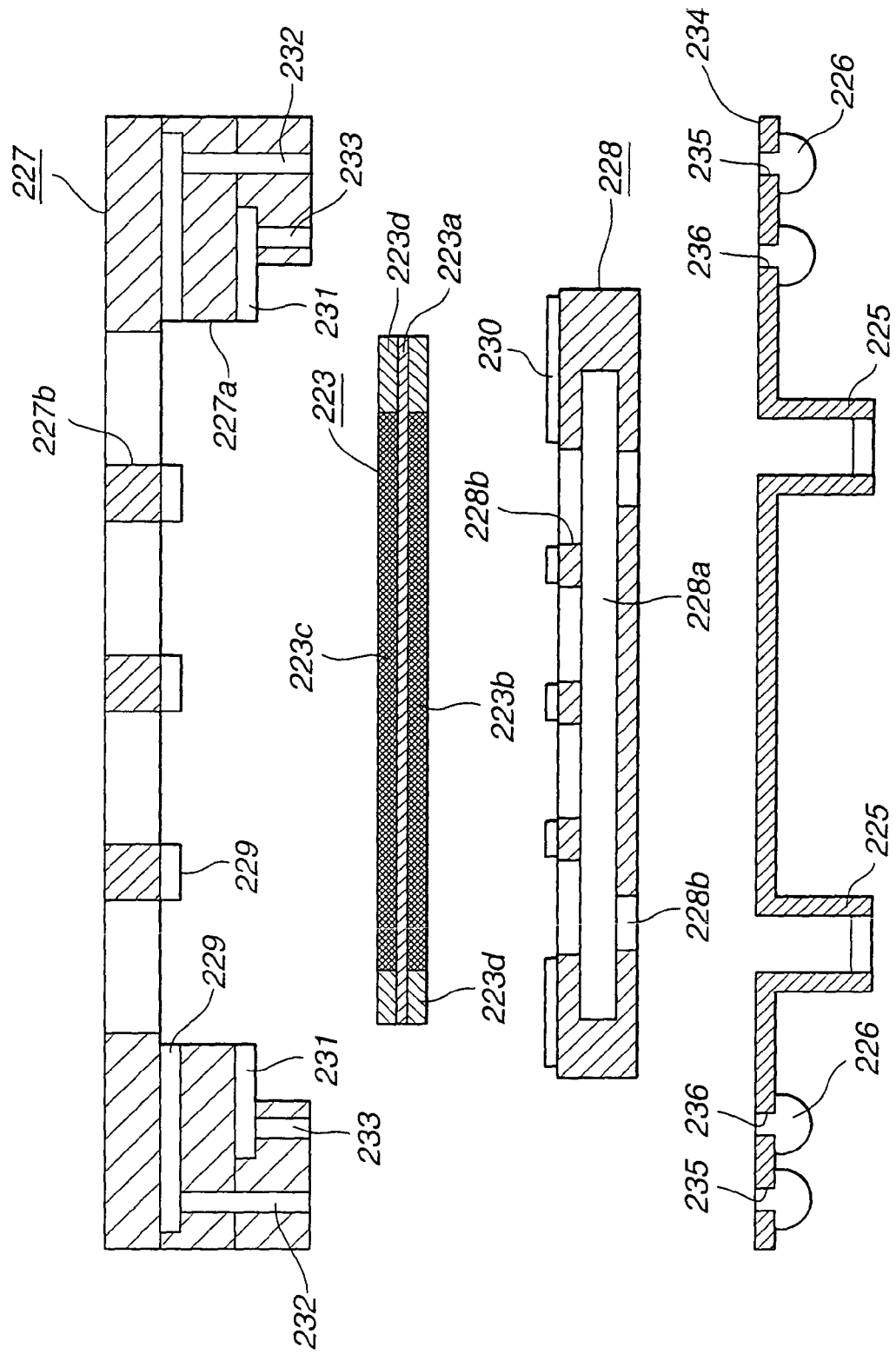
FIG. 27 is a schematic sectional view showing a state that the fuel cell shown in FIGS. 26A to 26C is disassembled according to an embodiment of the present invention.

FIG. 27 is a schematic sectional view showing a state that the fuel cell 242 shown in FIGS. 26A to 26C is disassembled. The structure of the contained power generator 223 is the same as that of the above-described embodiment. The power generator 223 has a structure that an ion conductive film 223a is held at both sides between a pair of electrodes, that is, an anode 223b and a cathode 223c and peripheries thereof are sealed with a seal 223d. The power generator 223 is sandwiched in between a base substrate 227 and a fuel supply part 228. The base substrate 227 forms a part of the housing 221 and employs, for instance, a resin substrate such as glass epoxy, phenolic resin, polyimide, etc., or an inorganic substrate such as ceramics, glass, silicon, etc. The base substrate 227 has a recessed part 227a capable of housing the power generator 223. Air intake opening parts 227b are formed correspondingly to the recessed part 227a. Cathode current collectors 229 are formed on the inner surface of the base substrate 227, that is, a surface that comes into contact with the cathode 223c of the power generator 223.

On the other hand, the fuel supply part 228 is arranged so as to cover the power generator 223 housed in the base substrate 227. The fuel supply part 228 has a passage 228a for hydrogen as fuel fluid and hydrogen intake opening parts 228b formed on a surface that comes into contact with the anode 223b of the power generator 223. Further, the hydrogen intake opening parts 228b are formed on a wiring member mounting surface of the power generator 223. On the surface of the fuel supply part 228 that comes into contact with the anode 223b of the power generating 223, anode current collectors 230 are formed integrally. Otherwise, the fuel supply part 228 itself may be made of a conductive material to serve as an anode current collector.

The power generator 223 is sandwiched in between the base substrate 227 and the fuel supply part 228 so that the current collecting structures of the anode 223b and the cathode 223c of the power generator 223 are realized. In this embodiment, the base substrate 227 has a three-layer structure. In the parts of the base substrate 227 that come into contact with the fuel supply part 228, wiring layers 231 connected to the anode current collectors 230 are formed. Electric connections between the respective layers are carried out through via holes 232 and 233. The fuel supply part 228 is preferably fixed to the base substrate 227 under this state. Further, the fuel supply part 228 may be fixed to the base substrate 227 simultaneously with the attachment of a cover substrate as described below. As a fixing method, a bonding method by a resin may be exemplified.

In the back surface side of the base substrate 227 located in the lower part of FIG. 27, a cover substrate 234 is provided. The power generator 223 and the fuel supply part 228 are secured in the recessed part 227a by the cover substrate 234. In the cover substrate 234, via holes 235 and 236 are provided so as to correspond to the via holes 232 and 233. Further, hemispherical terminals 226 are formed so as to correspond to the via holes 235 and 236. As the hemispherical terminals 226, for instance, solder balls can be used. The solder balls are fixed to the connecting terminals 212 formed on the printed-wiring board 210 of the electric device side by performing a reflowing process to achieve an electric connection. Further, on the cover substrate 234, the fuel joints 225 as the tubular fuel passages are formed at positions corresponding to the opening parts 228b formed on the wiring member mounting surface side of the fuel supply part 228.

Figure 28:
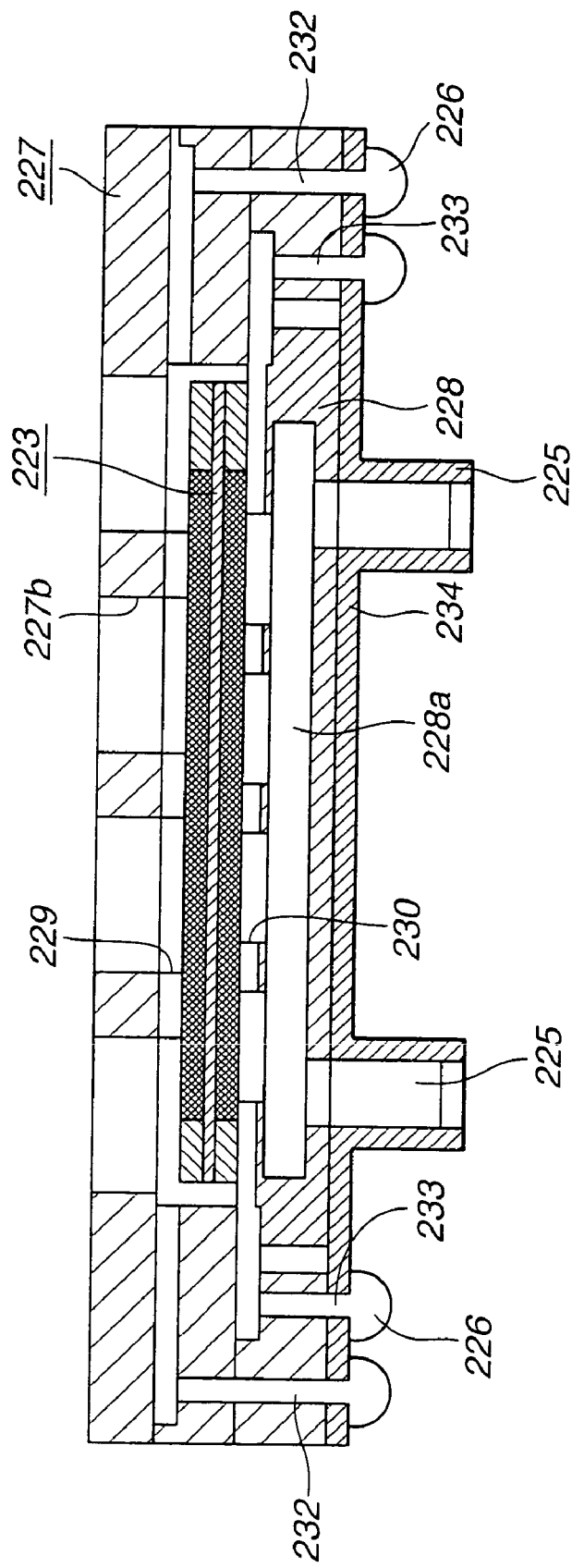
FIG. 28 is a schematic sectional view showing a state that the fuel cell shown in FIGS. 26A to 26C is assembled according to an embodiment of the present invention.

FIG. 28 shows an assembled state of the fuel cell. Under the assembled state, the housing 221 is formed and packaged by the base substrate 227 and the cover substrate 234. The fuel joints 225 and the terminals 226 are arranged on the wiring member mounting surface. Accordingly, the fuel cell 242 having the above-described structure is configured as a fuel cell having a surface-mount type package. The surface-mount type package form is not limited to the BGA and, for instance, a QFP (Quad Flat Package) or the like may be used.

FIGS. 29A to 29D show sectional views showing steps for mounting the fuel cell 242 shown in FIG. 26 on a printed-wiring board 210. Connecting terminals 212 are formed on the printed-wiring board 210 in which an upper layer 210a, an inner layer 210b and a lower layer 210c are bonded together by an adhesive or the like and integrally formed (see FIG. 29A). The terminals 226 of the fuel cell 242 are positioned on the positions of the connecting terminals 212 and the fuel joints 225 are positioned on the positions of fuel supports ports 211 and fuel passages 214a and 214b. Thus, the fuel joints 225 are connected to the fuel support ports 211 to mount the fuel cell 242 on the printed-wiring board 210 (see FIG. 29B)

Figure 29A:
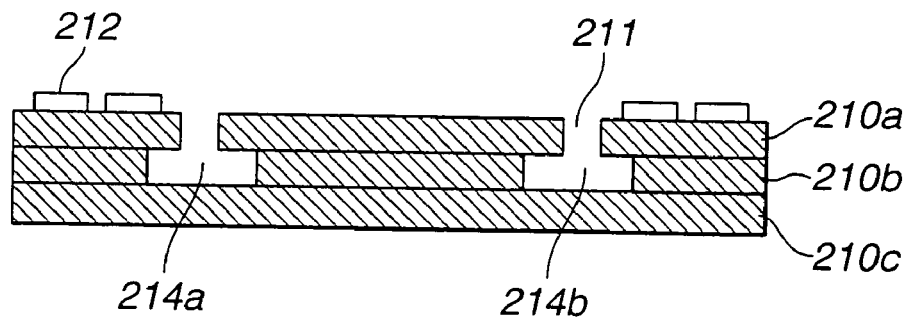
FIGS. 29A to 29D show steps for mount the surface-mount type fuel cell on the printed-wiring board according to an embodiment of the present invention.
Figure 29B:
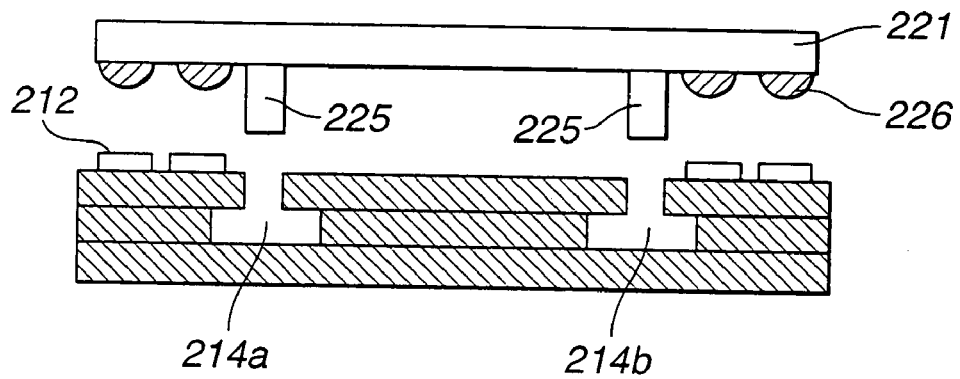
Figure 29C:
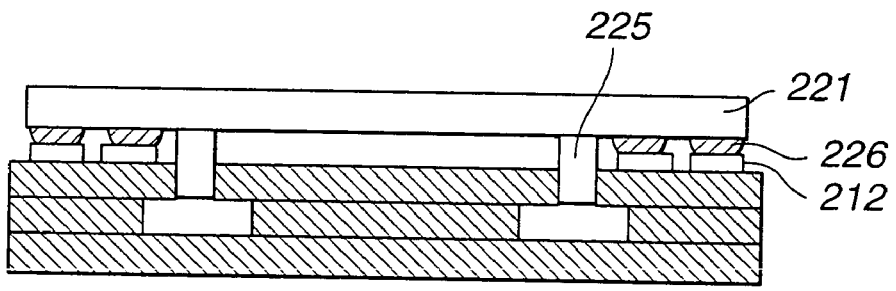
Figure 29D:
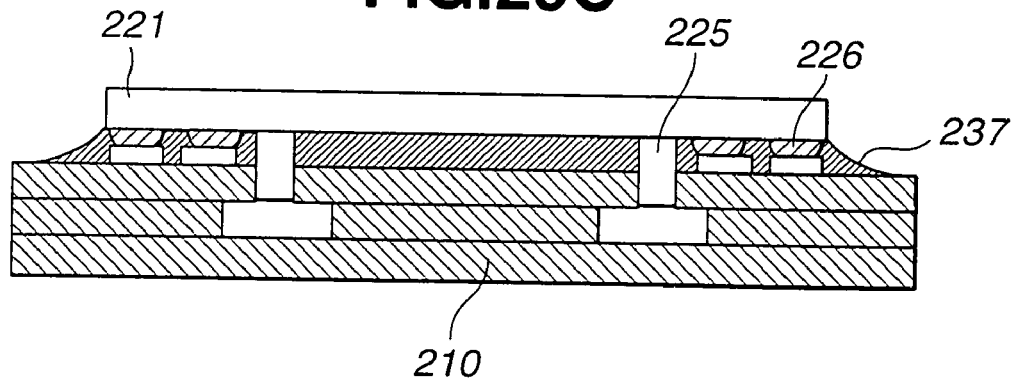

After the fuel cell 242 is mounted on the printed-wiring board 210, a reflowing process is carried out to solder the terminals 226 to the connecting terminals 212 and electrically connect wiring provided on the printed-wiring board 210 to the fuel cell 242 (see FIG. 29C). After that, a sealing resin 237 is injected into clearances between the printed-wiring board 210 and the fuel cell 242 and heat-treated to cure the sealing resin 237 and perform resin sealing. The fuel cell 242 is securely fixed to the printed-wiring board 210 by the resin sealing to seal the fuel between the fuel joints 225, the fuel supply ports 211 and the fuel cell 242 and prevent the leakage of the fuel (see FIG. 29D). As the sealing resin 237, an epoxy resin or the like may be employed.

Also in the above-described embodiment, the fuel supply tube 250 is connected to the fuel passages 214a and 214b provided on the printed-wiring board 210 and the fuel such as hydrogen is injected to the printed-wiring board 210 from the fuel supply tube 250. Then, the fuel enters the fuel passages 214a and 214b of the inner layer 210b and reaches the fuel supply ports 211 provided in the upper layer 210a. The fuel reaching the fuel supply ports 211 enters the fuel supply part 228 through the fuel joints 225 to supply the fuel to the power generator 223.

As described above, in the power generator 223, hydrogen discharges an electron in the anode 223b side to become a proton. The proton passes through the ion conductive film 223a and moves to the cathode 223c side and receives the supply of the electron to react with oxygen and produce water in the cathode 223c. In such a way, the fuel can be continuously supplied to the fuel cell 242 mounted on the surface through the fuel passages provided on the printed-wiring board 210. Here, the example that the fuel is supplied to the fuel joints 225 from the two systems of the fuel passages 214a and 214b is illustrated above. However, such a design as to supply fuel from one system or more systems may be realized depending on the size or the form of the fuel cell 242, a flow rate allowable by the fuel passages 214, etc.

Figure 30:
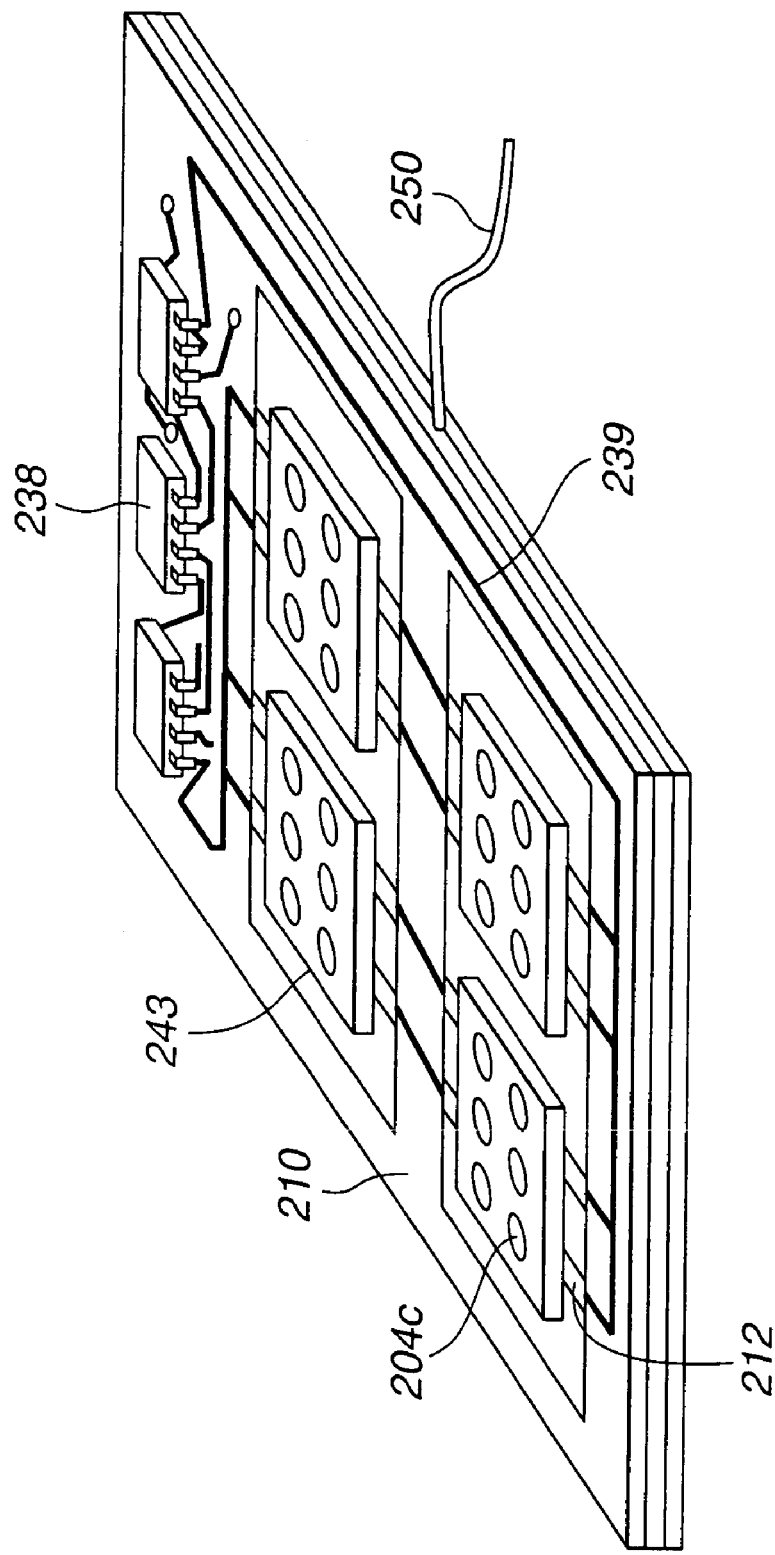
FIG. 30 shows an electric device having a printed-wiring board on which a fuel cell and electronic parts are mounted according to an embodiment of the present invention.

FIG. 30 is a schematic view of an electric device showing that a printed-wiring board 210 is connected to fuel cells 243 by the above-described connecting method. On the printed-wiring board 210, a plurality of fuel cells 243 are mounted and a fuel supply tube 250 is connected to fuel passages 214a and 214b (illustrations are omitted) formed on the printed-wiring board 210. Further, on the upper layer of the printed-wiring board 210, electronic parts 238 such as semiconductor devices are mounted. Further, connecting terminals 212 and electric wiring 239 formed on the printed-wiring board 210 allow the fuel cells 243 to be electrically connected to the electronic parts 238. The electronic parts 238 and the fuel cells 243 may be mounted on the printed-wiring board 210 by respectively separate steps. When the fuel cells 243 are mounted, a reflowing process or resin sealing may be simultaneously carried out.

Fuel is supplied to the fuel cells 243 from the fuel supply tube 250 through the fuel passages 214 of the printed-wiring board 210 and air is taken from air intake ports 204c to drive the electronic parts 238 by electric power generated by the fuel cells 243.

The fuel of the fuel cell according to the present invention is not limited to hydrogen gas, and other fuels such as liquefied hydrogen, methane, ethane, propane, isobutane, n-butane, hexane, heptane, octane, nonane, decane, methanol, or the like may be used.

INDUSTRIAL APPLICABILITY

As mentioned above, the fuel cell according to an embodiment of the present invention can be directly mounted on a mounting board and a fuel cell housing part does not need to be provided on the electric device on which the fuel cell is mounted. Accordingly, the wiring or the connector from the device, the space for housing, the fixing means, the cover, or the like are not necessary so that the structure of the device can be simplified and miniaturized. The fuel cell or the power generator is directly mounted on the mounting board so that a restriction in design such as the arrangement of the device or wiring patterns, etc. can be reduced. Free layouts can be realized, for instance, the fuel cell can be disposed near the device having large consumed power or plural fuel cells can be arranged. Therefore, unnecessary wiring or space and the loss of output, etc. can be decreased.

Further, when the fuel cell according to an embodiment of the present invention is manufactured, the production technology and a device of, what is called a semiconductor post-process, for instance, a multi-layer board is used for a housing or a packaging by a resin mold can be utilized to easily realize a mass production. Since the fuel cell is packaged so that the fuel cell can be incorporated in the electric device in a production site by an ordinarily used component mounting apparatus, the production steps of the device can be reduced. Furthermore, since the dimension of the package, the form and dimension of a terminal, mounting steps, etc. are easily standardized, a compatibility can be improved.

Since the fuel cell according to an embodiment of the present invention is fixed and electrically connected to the electric device and the piping of fuel are all carried out by one process, assembly steps can be greatly reduced. Further, since the mounting of the fuel cell on the device and the piping of fuel can be achieved by using a conventional chip mounting apparatus, new plant and equipment investment is not required. Still further, since the fuel cell is fixed and electrically connected to the electric device and the piping for fuel is provided on the lower surface of the fuel cell, connecting parts or an attaching space are not necessary so that the device can be miniaturized.

Since the fuel cell according to an embodiment of the present invention can be directly connected to the passages formed on the printed-wiring board, a fuel sealing with a higher air-tightness can be realized. Further, when a thermoplastic resin is used as a sealing resin, the fuel cell can be reworked and easily repaired and parts thereof can be readily replaced by other parts.

The electronic parts and the fuel cell are mounted in a mixed way on the printed-wiring board so that the electric device can be miniaturized and a production process can be shortened.

According to the printed-wiring board and a method for manufacturing it according to the present invention, a new printed-wiring board having not only a function as a circuit board, but also a function as fuel passages can be provided. Further, according to the electric device according to the present invention, a restriction in design can be lightened, the number of parts can be decreased and the device can be miniaturized. Still further, according to the connector for a fuel cell according to an embodiment of the present invention, an electric connection can also serve as fuel joints between a power generating cell and a fuel supply source, and a new connection form can be provided.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. An electronic board comprising:
    a fuel passage layer that comprises an insulating material and that defines at least one inner fuel passage space, the fuel passage layer including
        a plurality of openings formed into a surface of the fuel passage layer, the openings enabling a fuel to be communicated from the inner fuel passage to a power generator of a fuel cell, wherein the openings are formed at positions corresponding to fuel ports, and
        wiring patterns formed on both sides of the fuel passage layer such that positions of the wiring patterns are different than the positions of the openings;
    a first wiring layer including an insulating base and wiring patterns formed on both surfaces of the insulating base, the first wiring layer formed on the surface of the fuel passage layer and including a plurality of openings, each one of the openings of the first wiring layer fluidly connected to a respective one of the openings formed into the surface of the fuel passage layer; and
    a second wiring layer including an insulting base and wiring patterns formed on both surfaces of the insulating base, the second wiring layer formed on a second surface of the fuel passage layer such that the fuel passage layer is an inner layer,
    wherein wirings formed on both sides of the first wiring layer, the fuel passage layer and the second wiring layer are electrically interconnect through contact holes formed in the first wiring layer, the fuel passage layer and the second wiring layer.

2. The electronic board according to claim 1, wherein the at least one inner fuel passage space is shaped as at least one of a groove and a bore.

3. The electronic board according to claim 1, wherein the at least one inner fuel passage space includes at least one pipe-shaped part.

4. The electronic board according to claim 1, wherein the fuel ports are located so as to be opposed to the openings formed in the fuel passage layer.

5. The electronic board according to claim 1, wherein the electronic board is incorporated in an electric device.

6. The electronic board according to claim 5, wherein the electronic board is a circuit board of the electric device.

7. The electronic board according to claim 1, wherein the first wiring layer, the fuel passage layer and the second wiring layer are laminated and pressed together to form an integrated electronic board.

8. The electronic board according to claim 1, wherein the second wiring layer covers the inner fuel passage to prevent fuel leakage.

* * * * *